United States Patent
Higo et al.

(10) Patent No.: US 10,783,932 B2
(45) Date of Patent: Sep. 22, 2020

(54) MAGNETIC MEMORY, SEMICONDUCTOR DEVICE, ELECTRONIC DEVICE, AND METHOD OF READING MAGNETIC MEMORY

(71) Applicant: SONY SEMICONDUCTOR SOLUTIONS CORPORATION, Kanagawa (JP)

(72) Inventors: Yutaka Higo, Kanagawa (JP); Masanori Hosomi, Tokyo (JP); Hiroyuki Ohmori, Kanagawa (JP); Kazuhiro Bessho, Kanagawa (JP); Hiroyuki Uchida, Kanagawa (JP); Yo Sato, Kanagawa (JP); Naoki Hase, Tokyo (JP)

(73) Assignee: SONY SEMICONDUCTOR SOLUTIONS CORPORATION, Kanagawa (JP)

(*) Notice: Subject to any disclaimer, the term of this patent is extended or adjusted under 35 U.S.C. 154(b) by 0 days.

(21) Appl. No.: 16/486,585

(22) PCT Filed: Dec. 1, 2017

(86) PCT No.: PCT/JP2017/043299
§ 371 (c)(1),
(2) Date: Aug. 16, 2019

(87) PCT Pub. No.: WO2018/159045
PCT Pub. Date: Sep. 7, 2018

(65) Prior Publication Data
US 2019/0385647 A1 Dec. 19, 2019

(30) Foreign Application Priority Data
Mar. 2, 2017 (JP) ................... 2017-039088

(51) Int. Cl.
*G11C 5/06* (2006.01)
*G11C 5/08* (2006.01)
(Continued)

(52) U.S. Cl.
CPC ............. *G11C 5/08* (2013.01); *G11C 5/063* (2013.01); *G11C 11/16* (2013.01); *G11C 11/161* (2013.01);
(Continued)

(58) Field of Classification Search
CPC ... G11C 11/16; G11C 11/161; G11C 11/1675; G11C 11/1673; G11C 5/063; H01L 27/226; H01L 43/02; H01L 43/08; H01L 43/10
See application file for complete search history.

(56) References Cited

U.S. PATENT DOCUMENTS 6,052,315 A 4/2000 Katayama et al.
7,166,881 B2 * 1/2007 Lin .................... G11C 11/15
257/295

(Continued)

FOREIGN PATENT DOCUMENTS

JP 10-334674 A 12/1998
JP 2008-287852 A 11/2008

OTHER PUBLICATIONS

International Search Report and Written Opinion of PCT Application No. PCT/JP2017/043299, dated Dec. 26, 2017, 7 pages of ISRWO.

*Primary Examiner* — Toan K Le
(74) *Attorney, Agent, or Firm* — Chip Law Group

(57) ABSTRACT

To provide a magnetic memory for storing multi-level information capable of reading while sufficiently securing a read margin. Provided is a magnetic memory including: first and second magnetic storage elements that are provided
(Continued)

between a first wiring and a second wiring crossing each other, and are electrically connected in series; a third wiring electrically connected between the first and second magnetic storage elements; a first determination unit that determines a magnetization state of the first magnetic storage element on the basis of a current flowing to the first magnetic storage element through the third wiring; and a second determination unit that determines a magnetization state of the second magnetic storage element on the basis of a current flowing to the first and second magnetic storage elements through the first wiring, in which the determination state of the second determination unit is changed on the basis of the determination result of the first determination unit.

12 Claims, 9 Drawing Sheets

(51) Int. Cl.
G11C 11/16 (2006.01)
H01L 27/22 (2006.01)
H01L 43/02 (2006.01)
H01L 43/08 (2006.01)
H01L 43/10 (2006.01)

(52) U.S. Cl.
CPC ...... *G11C 11/1673* (2013.01); *G11C 11/1675* (2013.01); *H01L 27/226* (2013.01); *H01L 43/02* (2013.01); *H01L 43/08* (2013.01); *H01L 43/10* (2013.01)

(56) References Cited

U.S. PATENT DOCUMENTS

| | | | |
|---|---|---|---|
| 2003/0161180 A1* | 8/2003 | Bloomquist | G11C 11/1655 365/173 |
| 2006/0279981 A1* | 12/2006 | Diao | G11C 11/16 365/158 |
| 2008/0278994 A1 | 11/2008 | Katti | |
| 2011/0123022 A1* | 5/2011 | Oishi | G06F 7/588 380/46 |
| 2014/0167831 A1* | 6/2014 | Wu | H03K 3/59 327/291 |
| 2014/0340958 A1* | 11/2014 | Gharia | G11C 11/1675 365/158 |

* cited by examiner

MAGNETIC MEMORY, SEMICONDUCTOR DEVICE, ELECTRONIC DEVICE, AND METHOD OF READING MAGNETIC MEMORY

CROSS REFERENCE TO RELATED APPLICATIONS

This application is a U.S. National Phase of International Patent Application No. PCT/JP2017/043299 filed on Dec. 1, 2017, which claims priority benefit of Japanese Patent Application No. JP 2017-039088 filed in the Japan Patent Office on Mar. 2, 2017. Each of the above-referenced applications is hereby incorporated herein by reference in its entirety.

TECHNICAL FIELD

The present disclosure relates to a magnetic memory, a semiconductor device, an electronic device, and a method of reading a magnetic memory.

BACKGROUND ART

With the rapid development of various information devices ranging from high-capacity servers to mobile terminals, further higher performance such as higher integration, higher speed, and lower power consumption, has been pursued in the elements such as memory and logic that constitute the various information devices. In particular, advances in non-volatile semiconductor memories are remarkable. For example, flash memories as large-capacity file memories are being widely used and almost expel hard disk drives. On the other hand, considering application to code storage and working memories, various types of semiconductor memories such as ferroelectric random access memory (FeRAM), magnetic random access memory (MRAM), and phase-change random access memory (PCRAM) have been developed to replace currently generally used NOR flash memory, dynamic random access memory (DRAM), or the like. Note that some of these have already been put to practical use.

The MRAM, which is one of the above-mentioned, stores information by utilizing the change in the electrical resistance by changing the magnetization state of the magnetic body of the magnetic storage element of the MRAM. Accordingly, the stored information can be read by determining the resistance state of the magnetic storage element determined by the change in the magnetization state, specifically, the magnitude of the electrical resistance of the magnetic storage element. Such an MRAM is capable of high-speed operation, can be rewritten almost infinitely (more than $10^{15}$ times), and has high reliability, so that the MRAM is already used in fields such as industrial automation and aircraft. Moreover, the MRAM is expected to be developed into code storage and working memory in the future because of its high speed operation and high reliability.

Moreover, among the MRAMs, an MRAM that reverses the magnetization of a magnetic body using spin torque magnetization reversal has the above-described advantages such as high-speed operation, and can achieve low power consumption and large capacity so that there are further greater expectations. Note that such an MRAM using spin torque magnetization reversal is called spin transfer torque-magnetic random access memory (STT-MRAM) (spin injection type MRAM).

Furthermore, in order to increase the storage capacity, in other words, to increase the capacity, densification of STT-MRAM is being considered. One of the methods for achieving densification is to place a plurality of magnetic storage elements in one memory cell and store multi-level information in one memory cell. For example, as disclosed in Patent Document 1 below, a configuration in which two magnetic storage elements vertically stacked with respect to a substrate are electrically connected in series in one memory cell may be mentioned. Moreover, Patent Document 2 below discloses a method of reading a memory cell storing multi-level information.

In writing of a magnetic memory in which a plurality of magnetic storage elements as described above is arranged in one memory cell and multi-level information is stored in one memory cell, two different magnetic storage elements included in one memory cell can be put in two types of resistance states (high resistance state and low resistance state). For example, in one memory cell, combinations of four types of resistance states (for example, four types of $Ra+Rb$, $Ra+Rb+\Delta Rb$, $Ra+Rb+\Delta Ra$, and $Ra+Rb+\Delta Ra+\Delta Rb$) exist, and in reading the memory cell, stored information is read by determining the four types of resistance states.

CITATION LIST

Patent Document

Patent Document 1: Japanese Patent Application Laid-Open No. 2005-310829
Patent Document 2: International Publication 2011/135984

Non-Patent Document

Non-Patent Document 1: S. Mangin et al. Nature materials, vol. 5 March 2006, p. 210

SUMMARY OF THE INVENTION

Problems to be Solved by the Invention

In reading of a magnetic memory in which a plurality of magnetic storage elements as described above is arranged in one memory cell and multi-level information is stored in one memory cell, in a case where reading is performed in a similar manner to a manner of a single bit magnetic memory, the read margin is reduced. In detail, in the above-described memory cell reading, it must be distinguished whether it is any of the adjacent resistance states among four types of resistance states (for example, four types of $Ra+Rb$, $Ra+Rb+\Delta Rb$, $Ra+Rb+\Delta Ra$, and $Ra+Rb+\Delta Ra+\Delta Rb$). However, the difference between the resistance values in the four types of resistance states is smaller than the difference between the resistance values of the two types of resistance states in a single bit magnetic memory having one magnetic storage element in one memory cell, so that the read margin is reduced. When the read margin is reduced, it becomes difficult to determine the resistance state in the magnetic memory that stores multi-level information due to manufacturing variations or the like, and a read error easily occurs or a large number of defective memory cells from which information cannot be read occur. Accordingly, in a magnetic memory for storing multi-level information, a reading method capable of reading while sufficiently securing a read margin has been required.

Therefore, the present disclosure suggests a novel and improved magnetic memory, semiconductor device, electronic device, and reading method of a magnetic memory capable of reading while sufficiently securing a read margin in a magnetic memory storing multi-level information.

Solutions to Problems

According to the present disclosure, provided is a magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element on the basis of a current flowing through the first magnetic storage element through the third wiring; and a second determination unit that determines a magnetization state of the second magnetic storage element on the basis of a current flowing through the first and second magnetic storage elements through the first wiring, in which the determination state of the second determination unit is changed on the basis of the determination result of the first determination unit.

Furthermore, according to the present disclosure, provided is a semiconductor device including a magnetic memory including a plurality of magnetic storage elements that holds information in a magnetization state of a magnetic body, and an operation device provided on the same chip as the magnetic memory, the magnetic memory including: first and second magnetic storage elements that are provided between a first wiring and a second wiring crossing each other, and are electrically connected in a series; a third wiring electrically connected between the first and second magnetic storage elements; a first determination unit that determines a magnetization state of the first magnetic storage element on the basis of a current flowing through the first magnetic storage element through the third wiring; and a second determination unit that determines a magnetization state of the second magnetic storage element on the basis of a current flowing through the first and second magnetic storage elements through the first wiring, in which the determination state of the second determination unit is changed on the basis of the determination result of the first determination unit.

Furthermore, according to the present disclosure, provided is an electronic device including a magnetic memory including a plurality of magnetic storage elements that holds information in a magnetization state of a magnetic body, the magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element on the basis of a current flowing through the first magnetic storage element through the third wiring; and a second determination unit that determines a magnetization state of the second magnetic storage element on the basis of a current flowing through the first and second magnetic storage elements through the first wiring, in which the determination state of the second determination unit is changed on the basis of the determination result of the first determination unit.

Moreover, according to the present disclosure, provided is a method of reading a magnetic memory including a plurality of magnetic storage elements that holds information in a magnetization state of a magnetic body, the magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element; and a second determination unit that determines a magnetization state of the second magnetic storage element, the method including determining by the first determination unit the magnetization state of the first magnetic storage element on the basis of a current flowing through the first magnetic storage element through the third wiring, changing a determination state of the second determination unit on the basis of the determination result of the first determination unit, and determining by the second determination unit the magnetization state of the second magnetic storage element on the basis of a current flowing through the first and second magnetic storage elements through the first wiring.

Effects of the Invention

As described above, according to the present disclosure, in a magnetic memory for storing multi-level information, reading can be performed while sufficiently securing a read margin.

Note that the effect described above is not necessarily limitative, and any of the effects shown in the present specification or other effects that can be understood from the present specification may be exhibited together with the effect described above, or instead of the effect described above.

MODE FOR CARRYING OUT THE INVENTION

Figure 1:
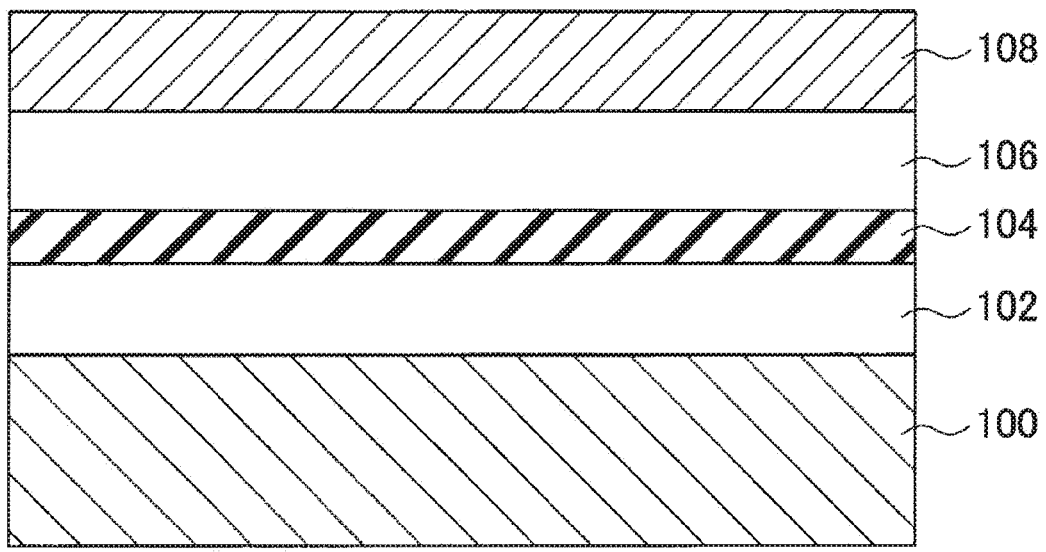
FIG. 1 is an explanatory view schematically showing an example of a stacked structure of an MTJ element 10 according to an embodiment of the present disclosure.

Preferred embodiments of the present disclosure will be described in detail below with reference to the accompanying drawings. Note that, in the present specification and the drawings, the same reference numerals are given to the constituent elements having substantially the same functional configuration, and redundant explanations are omitted.

Furthermore, in this specification and the drawings, a plurality of constituent elements having substantially the same functional configuration may be distinguished by attaching different alphabets after the same reference numerals. For example, a plurality of configurations having substantially the same functional configuration or logical meaning is distinguished as an MTJ element 10a and an MTJ element 10b as necessary. However, in a case where it is not necessary to particularly distinguish each of a plurality of constituent elements having substantially the same functional configuration, only the same reference numerals are attached. For example, in a case where there is no need to particularly distinguish between the MTJ element 10a and the MTJ element 10b, each of them is simply referred to as the MTJ element 10.

Furthermore, the drawings referred to in the following description are for explanation and promoting understanding of an embodiment of the present disclosure, and for the sake of clarity, the shapes, sizes, ratios, or the like shown in the drawings may differ from actual ones. Moreover, the devices and the like shown in the drawings can be appropriately designed and changed in consideration of the following description and known technologies. Furthermore, in the following description, the vertical direction of the stacked structure of a magnetic memory or the like corresponds to the relative direction in a case where the surface on the substrate provided with a magnetic storage element is upward, and may be different from the vertical direction according to the actual gravity acceleration.

Furthermore, in the following description, when describing the magnetization direction (magnetic moment) and magnetic anisotropy, for convenience, terms such as the "perpendicular direction" (the direction perpendicular to the film surface) and the "in-plane direction" (the direction parallel to the film surface) will be used. However, these terms do not necessarily mean the exact direction of magnetization. For example, words such as "the magnetization direction is the perpendicular direction" and "having perpendicular magnetic anisotropy" mean a state where magnetization in the perpendicular direction is dominant over magnetization in the in-plane direction. Similarly, for example, words such as "the magnetization direction is the in-plane direction" or "having in-plane magnetic anisotropy" mean a state where magnetization in the in-plane direction is dominant over magnetization in the vertical direction.

Furthermore, in the following description, "connection" means electrically connecting a plurality of elements, unless otherwise noted in the description of the circuit configuration. Moreover, "connection" in the following description includes not only a case of directly and electrically connecting a plurality of elements but also a case of indirectly and electrically connecting via other elements.

Note that the description will be given in the following order.

1. Technical background according to the present disclosure
  1.1. Overview of STT-MRAM
  1.2. Basic structure of MTJ element
  1.3. Regarding mechanism of writing and reading
  1.4. Regarding in-plane magnetization and perpendicular magnetization STT-MRAM
  1.5. Regarding examination of method of reading memory cell storing multi-level information
2. One embodiment of the present disclosure
  2.1. Configuration of magnetic memory 1
  2.2. Reading method
3. Conclusion
4. Supplement 1. Technical Background Related to the Present Disclosure 1.1. Overview of STT-MRAM First, before describing an embodiment of the present disclosure, the technical background of the present disclosure will be described. The technology according to the present disclosure relates to STT-MRAM (spin injection type MRAM).

As described above, the MRAM that stores information according to the magnetization state of the magnetic body can operate at high speed, can be rewritten almost infinitely (more than $10^{15}$ times), is highly reliable, and therefore, the MRAM is already used in various fields. Among such MRAMs, for the MRAM in which the magnetization of the magnetic body is reversed by the current magnetic field generated from the wiring, it is difficult to reduce the power consumption and increase the capacity, due to the method of the magnetization reversal. This is because, in the MRAM utilizing magnetization reversal using a current magnetic field from a wiring, a current equal to or greater than a predetermined threshold is necessary to generate a current magnetic field of a strength that can reverse the magnetization of the magnetic body, and the power consumption at the time of writing is likely to increase. Moreover, in the MRAM utilizing magnetization reversal using a current magnetic field from the wiring, since the wiring for generating the current magnetic field is provided for each magnetic storage element, there is limitation to the miniaturization of the magnetic storage element.

Therefore, an MRAM in which the magnetization of the magnetic body is reversed by a method other than using the current magnetic field from the wiring is considered. More specifically, the STT-MRAM in which the magnetization of a magnetic body is reversed using spin torque magnetization reversal is considered. The STT-MRAM has the advantages of an MRAM that can operate at high speed and the number of rewrites is almost infinite, and can be used to achieve lower power consumption and larger capacity, so that the STT-MRAM has high expectations.

As a storage element of the STT-MRAM, a magnetic tunnel junction (MTJ) element (magnetic storage element) is used. The MTJ element mainly includes a fixed layer and a storage layer including a magnetic body, and a nonmagnetic layer provided between the fixed layer and the storage layer. Then, when the spin-polarized electrons having passed through a magnetic body (fixed layer) having a magnetic moment fixed in a predetermined direction enter the other magnetic body (storage layer), the MTJ element performs storing using the fact that the magnetic moment reversal is generated by applying torque to the magnetic moment of another magnetic body. In detail, a current equal to or greater than a predetermined threshold flows, and the magnetic moment of the magnetic body to which a torque equal to or greater than the predetermined threshold is applied by the spin-polarized electrons reverses in a direction parallel to the applied torque. Note that the reversal direction of the magnetic moment can be controlled by changing the polarity of the current flowing through the magnetic body. Moreover, in the MTJ element, electrical resistance in the nonmagnetic layer is lower in the parallel state in which the directions of the magnetic moments of the fixed layer and the storage layer are the same than in the non-parallel state in which the directions of the magnetic moments of both are opposite, and the electrical resistance of the entire MTJ element is low. Therefore, in the MTJ element, 1/0 information is stored using the difference in the resistance state caused by the state of the magnetic moment (magnetization state).

The absolute value of the current required to cause the spin torque magnetization reversal as described above is 1 mA or less for the MTJ element of about 0.1 μm scale. Furthermore, the overall value of the inversion current decreases as the volume of the MTJ element decreases. Note that, in a case where the magnetization of the magnetic body is reversed using the current magnetic field generated from the wiring, the current required for the magnetization reversal is approximately several mA. Therefore, the STT-MRAM using spin torque magnetization reversal can operate with low power consumption because the current required for writing can be made extremely small compared to the MRAM using magnetization reversal due to the current magnetic field from the wiring.

Furthermore, in the MRAM using magnetization reversal by the current magnetic field from the wiring, a wiring such as a word line for generating a current magnetic field is required, but in the STT-MRAM, such a wiring becomes unnecessary. Therefore, the STT-MRAM can make the MTJ element have a simple structure as compared to the MRAM using the magnetization reversal by the current magnetic field from the wiring, and the miniaturization of the MTJ element becomes easy, so that further increasing capacity of the magnetic memory can be realized.

As described above, the STT-MRAM can achieve low power consumption and a large capacity while maintaining the characteristics of the MRAM in which rewriting of information can be performed at high speed and almost unlimitedly.

1.2. Basic Structure of MTJ Element

Next, the basic structure of the MTJ element 10 of the STT-MRAM using spin torque magnetization reversal will be described with reference to FIG. 1. FIG. 1 is an explanatory view schematically showing an example of a stacked structure of the MTJ element 10 according to an embodiment of the present disclosure.

The MTJ element 10 is a magnetic storage element that stores one piece of information (1/0). Above and below the MTJ element 10, wirings for address orthogonal to each other (in other words, a word line and a bit line) are provided, and the MTJ element 10 is connected to the word line and the bit line near the intersection of these wirings. Note that, in FIG. 1, the illustration of these wirings is omitted.

As shown in FIG. 1, the MTJ element 10 has a structure in which a fixed layer 102 having the magnetic moment fixed in a predetermined direction, a nonmagnetic layer 104, a storage layer 106 in which the direction of the magnetic moment is variable, and a cap layer 108 are sequentially stacked on a base layer 100. Furthermore, although not shown in FIG. 1, the MTJ element 10 is sandwiched between an upper electrode and a lower electrode. Moreover, one terminal of the MTJ element 10 is electrically connected to further another wiring (not shown) and a word line (not shown) via a selection transistor (not shown), and another terminal of the MTJ element 10 is electrically connected to a bit line (not shown). As a result, in the MTJ element 10 selected by the selection transistor, a voltage is applied between the lower electrode and the upper electrode of the MTJ element via the word line and the bit line, and writing and reading of the information on the storage layer 106 of the MTJ element 10 are performed.

The fixed layer 102 includes a magnetic body containing a ferromagnetic material, and the direction of the magnetic moment is fixed by a high coercive force or the like. The nonmagnetic layer 104 includes various nonmagnetic bodies or the like, and is provided between the fixed layer 102 and the storage layer 106. The storage layer 106 includes a magnetic body containing a ferromagnetic material, and the direction of the magnetic moment changes in accordance with the information to be stored. Moreover, the base layer 100 and the cap layer 108 function as an electrode, a control film of crystal orientation, a protective film, and the like.

Note that, although FIG. 1 shows, as the stacked structure of the MTJ10, a structure in which the nonmagnetic layer 104 and the fixed layer 102 are stacked downward with respect to the storage layer 106, but the MTJ element 10 is not limited to this structure. For example, the MTJ element 10 may further include another layer, or the positions of the fixed layer 102 and the storage layer 106 may be interchanged.

1.3. Mechanism of Writing and Reading

Subsequently, the mechanism of writing and reading of information in the MTJ element 10 will be described. First, the mechanism of writing information in the MTJ element 10 will be described. In the MTJ element 10, writing of information to the storage layer 106 is performed using spin torque magnetization reversal as described above.

Here, the details of the spin torque magnetization reversal will be described. Electrons are known to have two types of spin angular momentum. Therefore, the spin angular momentum is temporarily defined as two types of spin angular momentum, that is, an upward spin angular momentum and a downward spin angular momentum. In the inside the nonmagnetic body, the number of the upward spin angular momentum and the number of the downward spin angular momentum are the same, and in the inside of the ferromagnetic material, there is a difference between these two numbers.

Moreover, here, considered is a case where, in the MTJ element 10, the directions of the magnetic moments of the fixed layer 102 and the storage layer 106 are in an antiparallel state in which the directions are different from each other, and in this state, electrons are made to enter the storage layer 106 from the fixed layer 102.

In a case where electrons pass through the fixed layer 102, spin polarization occurs, in other words, a difference occurs in the number of upward spin angular momentum and downward spin angular momentum. Moreover, in a case where the thickness of the nonmagnetic layer 104 is sufficiently thin, this spin polarization is relaxed and before the state becomes unpolarized (the numbers of electrons facing upward and downward are identical) in a normal nonmagnetic body, the electrons can enter the storage layer 106.

In the storage layer 106, the direction of spin polarization is opposite to that of the entered electrons. Accordingly, in order to lower the energy of the entire system, a part of the entered electrons are reversed, that is, the direction of the spin angular momentum is changed. At this time, since the spin angular momentum is stored in the entire system, a reaction equivalent to the sum of the changes in spin angular momentum due to the reversed electrons is applied to the magnetic moment of the storage layer 106.

In a case where the current, in other words, the number of electrons passing per unit time is small, the total number of electrons that change the direction is also small, so that the change in spin angular momentum generated in the magnetic moment of the storage layer 106 is also small. On the other hand, when the current, in other words, the number of electrons passing per unit time is increased, a desired spin angular momentum change can be applied to the magnetic moment of the storage layer 106 within the unit time. The time change of the spin angular momentum is a torque, and when the torque exceeds a predetermined threshold, the magnetic moment of the storage layer 106 starts to reverse, and becomes stable in the 180-degree reversed state. Note that the magnetic moment of the storage layer 106 becomes stable in the 180-degree reversed state because the magnetic body constituting the storage layer 106 has an easy magnetization axis and has uniaxial anisotropy. By the above mechanism, the MTJ element 10 changes from the antiparallel state to the parallel state in which the directions of the magnetic moments of the fixed layer 102 and the storage layer 106 are the same.

Furthermore, in the parallel state, in a case where the current is supplied reversely in such a direction as to cause electrons to move from the storage layer 106 to the fixed layer 102, the electrons reversed by being reflected by the fixed layer 102 when reaching the fixed layer 102 applies torque to the storage layer 106 as entering the storage layer 106. Accordingly, the magnetic moment of the storage layer 106 is reversed by the applied torque, and the MTJ element 10 changes from the parallel state to the antiparallel state.

However, the amount of the reverse current for causing reversal from the parallel state to the antiparallel state is larger than that in a case of reversing from the antiparallel state to the parallel state. Note that, the reversal from the parallel state to the antiparallel state occurs because, simply stated, since the magnetic moment of the fixed layer 102 is fixed, the reversal in the fixed layer 102 is difficult, and the magnetic moment of the storage layer 106 is reversed in order to preserve the spin angular momentum of the entire system. As described above, 1/0 storage in the MTJ element 10 is performed by supplying a current equal to or greater than a predetermined threshold corresponding to each polarity in the direction from the fixed layer 102 toward the storage layer 106 or in the opposite direction. As described above, 1/0 writing in the MTJ element 10 is performed by reversing the magnetic moment of the storage layer 106 in the MTJ element 10 and changing the resistance state of the MTJ element 10.

Next, the mechanism of reading information in the MTJ element 10 will be described. In the MTJ element 10, reading of information from the storage layer 106 is performed using a magnetoresistive effect. Specifically, in a case where a current is supplied between the lower electrode (not shown) and the upper electrode (not shown) sandwiching the MTJ element 10, the resistance state of the MTJ element 10 changes on the basis of whether the directions of the magnetic moments of the fixed layer 102 and the storage layer 106 are in a parallel state with each other or in the antiparallel state. Then, the information stored in the storage layer 106 can be read by determining the resistance state of the MTJ element 10, in other words, the magnitude of the electrical resistance indicated by the MTJ element 10.

1.4. Regarding In-Plane Magnetization and Perpendicular Magnetization STT-MRAM By the way, in the STT-MRAM, there are in-plane magnetization STT-MRAM using a magnetic body having magnetic anisotropy in the in-plane direction, and perpendicular magnetization STT-MRAM using a magnetic body having magnetic anisotropy in the perpendicular direction. In general, the perpendicular magnetization STT-MRAM is considered to be more suitable for lower power and larger capacity than the in-plane magnetization STT-MRAM. This is because the perpendicular magnetization STT-MRAM has a lower energy barrier to be exceeded in spin torque magnetization reversal, and is advantageous to maintain heat stability of a storage carrier in which the high magnetic anisotropy of the perpendicular magnetization film has become finer due to the increase in capacity.

Specifically, assuming that the reverse current of the in-plane magnetization STT-MRAM is Ic_para, the reverse current can be expressed by the following equations (1) and (2).

[Equation 1]

The reverse current from the parallel state to the antiparallel state:

$$Ic\_para = (A \cdot \alpha \cdot Ms \cdot V/g(0)/p)(Hk + 2\pi Ms) \quad (1)$$

The reverse current from the antiparallel state to the parallel state:

$$Ic\_para = -(A \cdot \alpha \cdot Ms \cdot V/g(\pi)/p)(Hk + 2\pi Ms) \quad (2)$$

Furthermore, assuming that the reverse current of the perpendicular magnetization STT-MRAM is Ic_perp, the reverse current can be expressed by the following equations (3) and (4).

[Equation 2]

The reverse current from the parallel state to the antiparallel state:

$$Ic\_perp = (A \cdot \alpha \cdot Ms \cdot V/g(0)/p)(Hk - 4\pi Ms) \quad (3)$$

The reverse current from the antiparallel state to the parallel state:

$$Ic\_perp = -(A \cdot \alpha \cdot Ms \cdot V/g(\pi)/p)(Hk - 4\pi Ms) \quad (4)$$

In the above equations (1) to (4), A is a constant, $\alpha$ is a damping constant, Ms is a saturation magnetization, V is an element volume, g(0)p and g($\pi$)p are coefficients related to the efficiency with which the spin torque is transmitted to the other magnetic layer in the parallel state and antiparallel state, respectively, and Hk is the magnetic anisotropy (see Non-Patent Document 1).

Here, the above equation (1) and the above equation (3) are compared with each other, and the above equation (2) and the above equation (4) are compared with each other in consideration of the reverse current in the in-plane magnetization STT-MRAM and the perpendicular magnetization STT-MRAM having the same magnetic body. According to the comparison, (Hk−4$\pi$Ms) in the case of the perpendicular magnetization STT-MRAM is smaller than (Hk+2$\pi$Ms) in the case of the in-plane magnetization STT-MRAM. Accordingly, it is understood that the reverse current is smaller in the perpendicular magnetization STT-MRAM, and is suitable in view of reducing the reverse current at the time of writing.

Note that the magnetic memory according to an embodiment of the present disclosure described below may be either the in-plane magnetization STT-MRAM or the perpendicular magnetization STT-MRAM.

1.5. Regarding Examination of Method of Reading Memory Cell Storing Multi-Level Information Next, a method of reading a memory cell storing multi-level information considered by the present inventors will be described. As described above, in order to increase the capacity of STT-MRAM, further densification of STT-MRAM is required.

However, the lower limit of the cell area of the STT-MRAM is determined on the basis of the design rules which define the shapes, sizes, or the like of the wirings such as bit lines and word lines and the contact parts connecting the wirings. Therefore, for the densification, a structure has been considered in which two magnetic storage elements stacked in the perpendicular direction in one memory cell are electrically connected in series, and multi-level information is stored in one memory cell.

Figure 7:
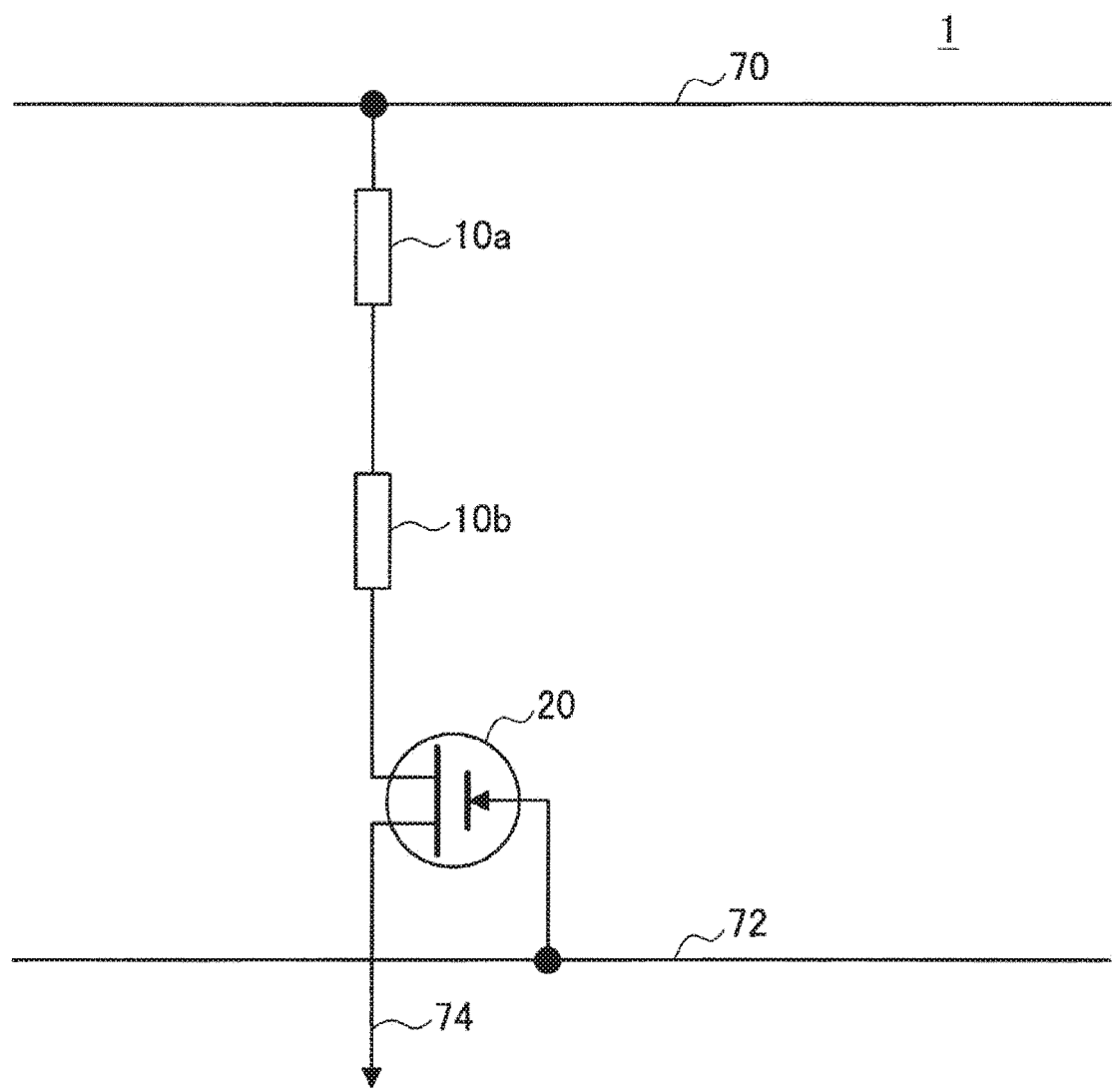
FIG. 7 is a circuit diagram schematically showing an example of a magnetic memory storing multi-level information according to a comparative example.

First, an example of a magnetic memory for storing multi-level information according to a comparative example considered here will be described with reference to FIG. 7. FIG. 7 is a circuit diagram schematically showing an example of a magnetic memory storing multi-level information according to the comparative example. Note that, in FIG. 7, a portion corresponding to one memory cell in the magnetic memory according to the comparative example is extracted and shown. As shown in FIG. 7, in the memory cell according to the comparative example, two MTJ elements 10a and 10b and the selection transistor 20 are electrically connected in series between the address wirings orthogonal to each other (in other words, bit line 70 and word line 72). Furthermore, the electrical resistance characteristics of these MTJ elements 10a and 10b are different from each other in the same storage state (resistance state) as described later. Moreover, in these MTJ elements 10a and 10b, as described later, the thresholds of the reverse current at which the magnetic moment of each storage layer 106 is reversed are also different from each other.

Figure 8:
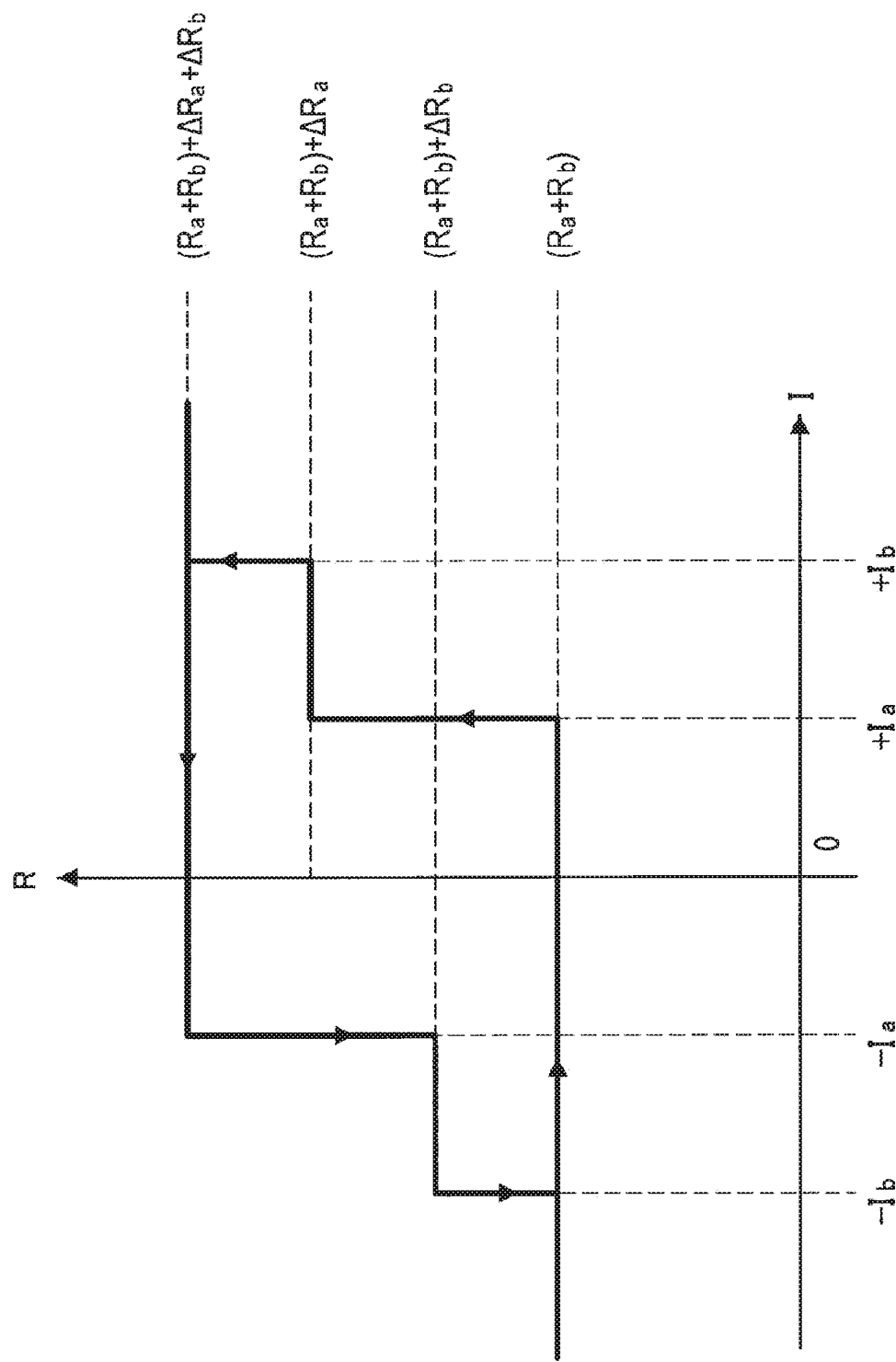
FIG. 8 is an explanatory diagram for explaining an example of a resistance state of a magnetic memory storing multi-level information according to a comparative example.
Figure 9:
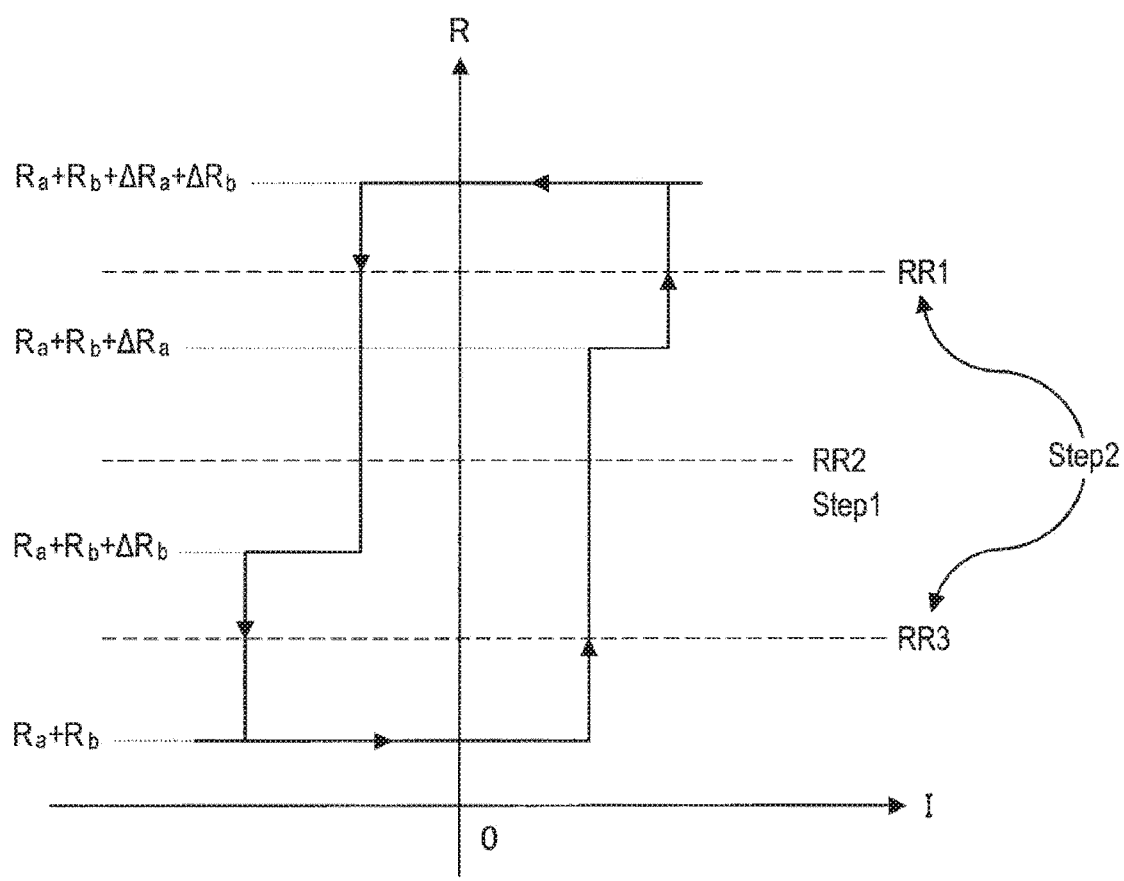
FIG. 9 is an explanatory diagram for explaining an example of a method of reading a magnetic memory storing multi-level information according to a comparative example.

Next, reading in the memory cell according to the comparative example shown in FIG. 7 will be described with reference to FIGS. 8 and 9. FIG. 8 is an explanatory diagram for explaining an example of a resistance state of a magnetic memory storing multi-level information according to a comparative example. Furthermore, FIG. 9 is an explanatory diagram for explaining an example of a method of reading a magnetic memory storing multi-level information according to a comparative example. Note that, in the following description, it is assumed that the electrical resistance characteristics of the MTJ elements 10a and 10b differ from each other in the same storage state (low resistance state or high resistance state). Specifically, for the MTJ element 10a, it is assumed that the resistance value in the low resistance state with low resistance is Ra, the resistance value in the high resistance state with high resistance is Ra+ΔRa, and for the MTJ element 10b, it is assumed that the resistance value in the low resistance state is Rb, and the resistance value in the high resistance state is Rb+ΔRb. Moreover, it is assumed that the resistance values Ra, Rb, Ra+ΔRa, and Rb+ΔRb have mutually different absolute values. In other words, the MTJ elements 10a and 10b in the low resistance state exhibit different resistance values, and the MTJ elements 10a and 10b in the high resistance state also exhibit different resistance values. Furthermore, in the following description, it is assumed that the reverse currents of the MTJ elements 10a and 10b are different from each other. Specifically, in the comparative example, it is assumed that the thresholds of the reverse current of the MTJ element 10a are +Ia and −Ia, and the thresholds of the reverse current of the MTJ element 10b are +Ib and −Ib. Moreover, in the comparative example, each of the thresholds +Ia, −Ia, +Ib, and −Ib of the reverse current is set so as to be different in absolute value, and satisfy −Ib<−Ia<0<+Ia<+Ib.

First, the resistance state of the memory cell according to the comparative example shown in FIG. 7 will be described with reference to FIG. 8. In the memory cell according to the comparative example, the combined series resistance of the MTJ elements 10a and 10b can be brought into four types of resistance states by a writing current. More specifically, the resistance states of the combined series resistance are four types of Ra+Rb+ΔRa+ΔRb, Ra+Rb+ΔRa, Ra+Rb+ΔRb, and Ra+Rb from the higher side. Information can be read from the memory cell according to the comparative example by determining the difference between these four resistance states.

Next, an example of the method of reading the memory cell according to the comparative example having the four types of resistance states described above will be described with reference to FIG. 9.

The reading method according to the comparative example is performed in two steps. First, in the reading method according to the comparative example, in the first step, the reference resistance to be compared with the combined series resistance is set to RR2, and the state of the combined series resistance in the memory cell is determined using a peripheral circuit not shown. At this time, the state of the combined series resistance is determined as one of two states of A) Ra+Rb+ΔRa+ΔRb or Ra+Rb+ΔRa, and B) Ra+Rb+ΔRb or Ra+Rb. Then, in a case where the result in the first step is A), the reference resistance is set to RR1 and the second step is performed. Moreover, according to the result of the second step, the state of the combined series resistance is decided to be either Ra+Rb+ΔRa+ΔRb or Ra+Rb+ΔRa. On the other hand, in a case where the result of the first step is B), the reference resistance is set to RR3 and the second step is performed. Moreover, according to the result of the second step, the state of the combined series resistance is decided to be either Ra+Rb+ΔRb or Ra+Rb.

At this time, in any case, in the second step, whether it is any of resistance states adjacent to each other among the four combined series resistance states is determined. The difference between the resistance values of adjacent resistance states at this time is smaller than the difference between the resistance values of two resistance states in a single bit memory cell having one magnetic storage element in one memory cell. Accordingly, in the memory cell according to the comparative example, in a case where the reading according to the above-described comparative example is performed, the read margin is reduced as compared with the single bit memory cell.

So, in a magnetic memory for storing multi-level information, a reading method capable of reading while sufficiently securing a read margin has been required. Then, considering such a situation, the present inventors came to create an embodiment of the present disclosure described below. Hereinafter, details of an embodiment of the present disclosure created by the present inventors will be described.

2. One Embodiment of the Present Disclosure

2.1. Configuration of Magnetic Memory

Figure 2:
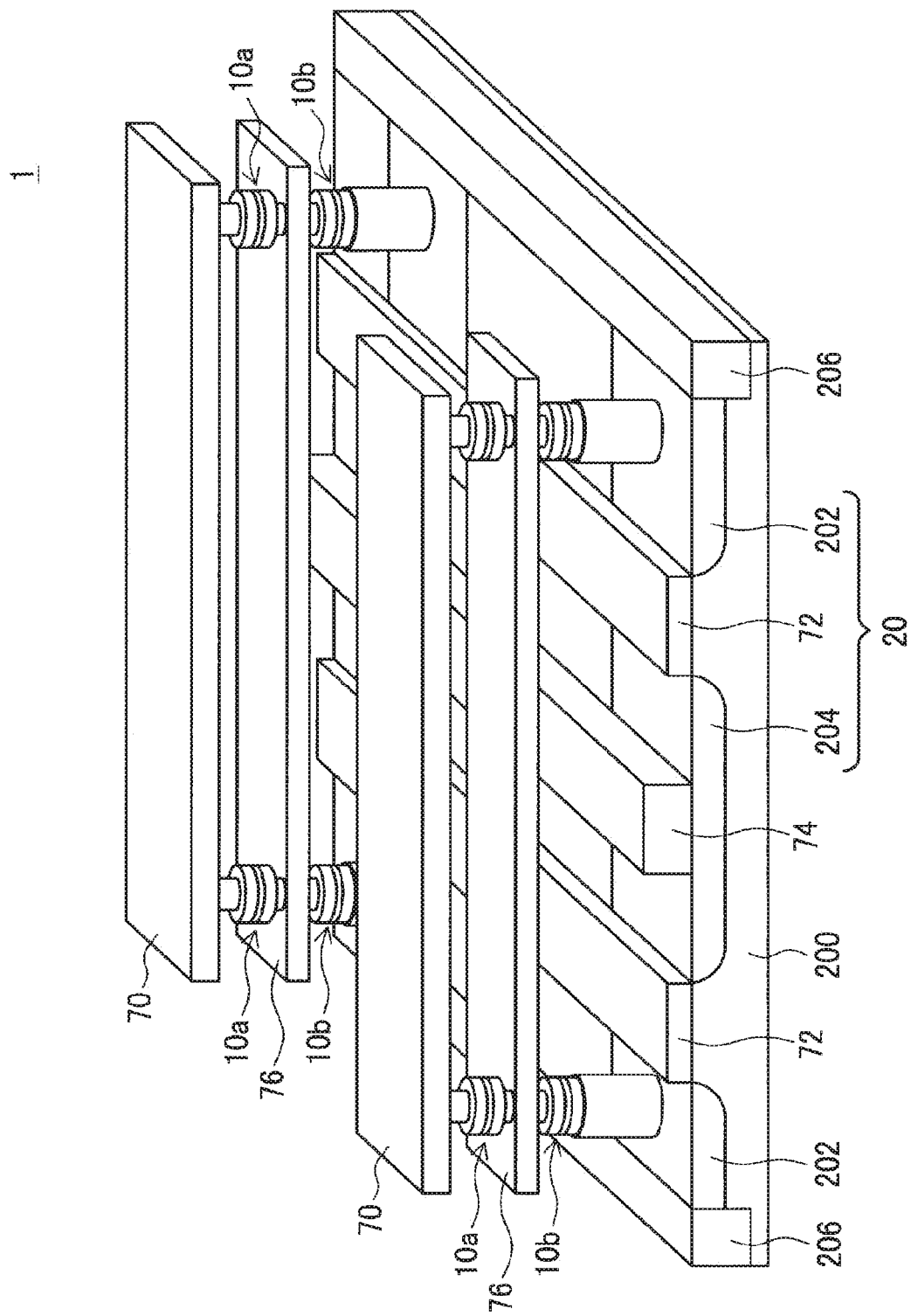
FIG. 2 is a schematic configuration view (perspective view) schematically showing an example of a magnetic memory 1 according to an embodiment of the present disclosure.
Figure 3:
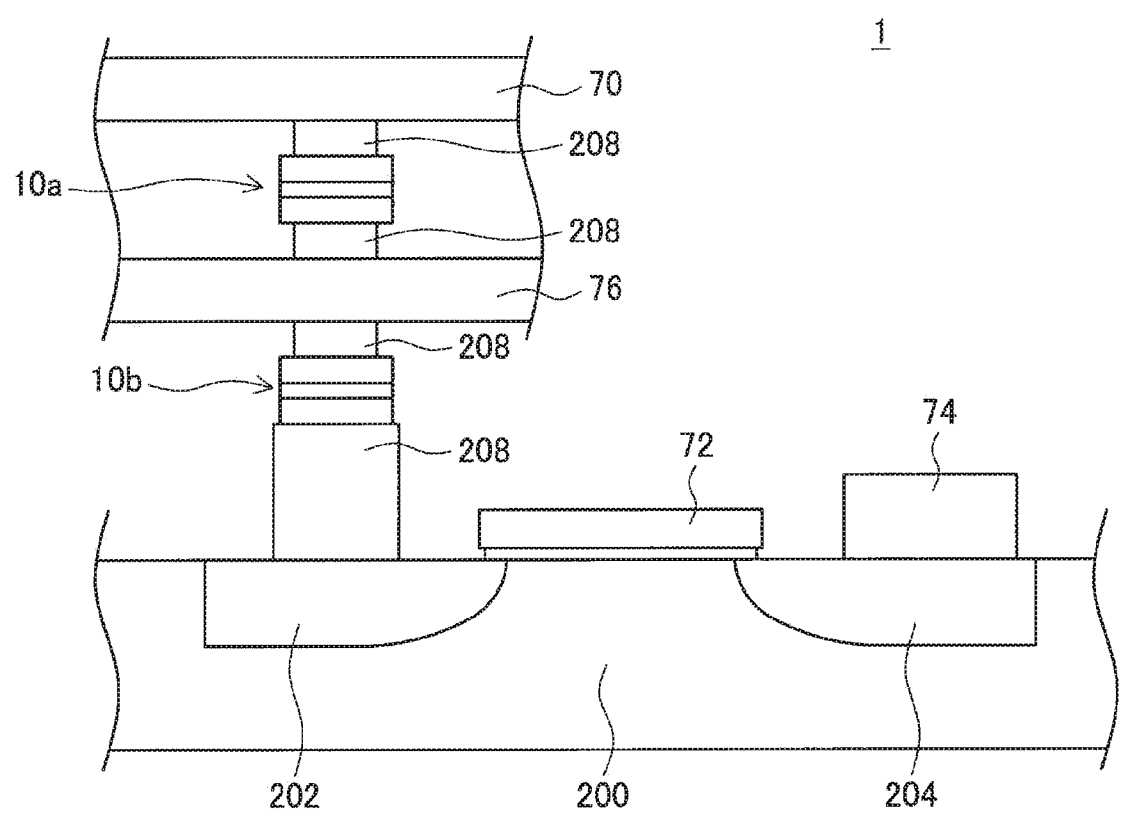
FIG. 3 is a schematic configuration view (cross-sectional view) schematically showing an example of the magnetic memory 1 according to an embodiment of the present disclosure.
Figure 4:
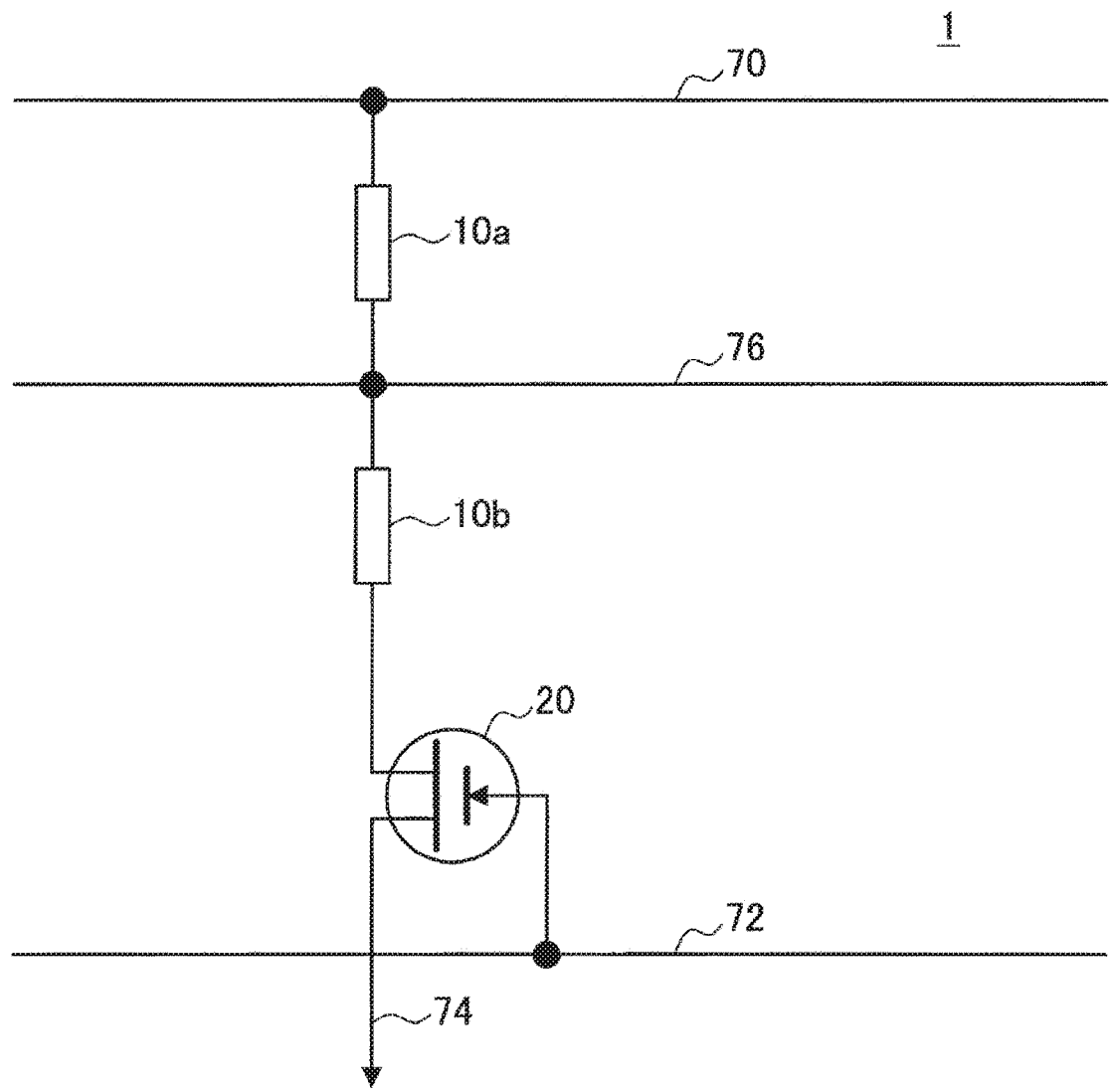
FIG. 4 is a circuit diagram schematically showing an example of the magnetic memory 1 according to an embodiment of the present disclosure.

The configuration of the magnetic memory 1 according to an embodiment of the present disclosure will be described below with reference to FIGS. 1 to 4. FIG. 2 is a schematic configuration view (perspective view) schematically showing an example of a magnetic memory 1 according to the present embodiment. FIG. 3 is a schematic configuration view (cross-sectional view) schematically showing an example of the magnetic memory 1 according to the present embodiment. Moreover, FIG. 4 is a circuit diagram schematically showing an example of the magnetic memory 1 according to the present embodiment. Note that, in the following description, it is assumed that the MTJ element 10 included in the magnetic memory 1 according to the present embodiment is a perpendicular magnetization MTJ element. However, in the present embodiment, the MTJ element 10 is not limited to the perpendicular magnetization MTJ element, and may be an in-plane magnetization MTJ element.

As shown in FIG. 2, in the magnetic memory 1 according to the present embodiment, the MTJ element (second magnetic storage element) 10a and the MTJ element (first magnetic storage element) 10b electrically connected in series are arranged near the intersection of two types of address wirings (for example, the bit line 70 and the word line 72) crossing (orthogonal to) each other. Moreover, a wiring (third wiring) 76 extending in parallel to the bit line (first wiring) 70 is electrically connected between the two MTJ elements 10a and 10b. Furthermore, the terminal of the MTJ element 10a opposite to the MTJ element 10b is electrically connected to the bit line 70, and the terminal of the MTJ element 10b opposite to the MTJ element 10a is electrically connected to the selection transistor 20. Note that the MTJ elements 10a and 10b have different resistance values in the same storage state (specifically, the electric resistance values of the MTJ elements 10a and 10b in the high resistance state are different from each other, and further, the electrical resistance values of the MTJ elements 10a and 10b in the low resistance state are different from each other), and moreover, the thresholds of the reverse current at which the magnetic moment of each storage layer 106 of the MTJ elements 10a and 10b is reversed are different from each other. Specifically, in the description below, for the MTJ element 10a, it is assumed that the resistance value in the low resistance state with low resistance is Ra, the resistance value in the high resistance state with high resistance is Ra+ΔRa, and moreover, it is assumed that the reverse current thresholds of the MTJ element 10a are +Ia and −Ia. Furthermore, for the MTJ element 10b, it is assumed that the resistance value in the low resistance state is Rb, the resistance value in the high resistance state is Rb+ΔRb, and the reverse current thresholds of the MTJ element 10b are +Ib and −Ib. Then, each of the thresholds +Ia, −Ia, +Ib, and −Ib of the reverse current is set so as to be different in absolute value, and satisfy −Ib<−Ia<0<+Ia<+Ib.

More specifically, as shown in FIG. 2, in the magnetic memory 1, a selection transistor 20 for selecting the MTJ elements 10a and 10b is formed in a region separated by the element separation layer 206 of the semiconductor substrate 200 such as a silicon substrate. The selection transistor 20 has a gate electrode (word line) 72, a source region 202, and a drain region 204. Note that, in the illustrated example, one memory cell includes two MTJ elements 10a and 10b and one selection transistor 20 for selecting the MTJ elements 10a and 10b. Then, in the magnetic memory 1, a plurality of memory cells is arrayed on the semiconductor substrate 200. Note that, in FIG. 2, a portion corresponding to four memory cells in the magnetic memory 1 is extracted and shown. Furthermore, in FIGS. 3 and 4, a portion corresponding to one memory cell in the magnetic memory 1 is extracted and shown.

Furthermore, the gate electrode 72 extends in the depth direction in FIG. 2 and also serves as one address wiring (word line (second wiring) 72). A wiring 74 is electrically connected to the drain region 204, and the drain region 204 is configured to be able to change the potential as appropriate through the wiring 74. Note that, in the example illustrated in FIG. 2, the drain region 204 is formed in common to the selection transistors 20 arranged adjacent to each other. Furthermore, two MTJ elements 10a and 10b electrically connected in series with each other are arranged above the source region 202. A wiring 76 extending in a direction orthogonal to the word line 72 is electrically connected between the two MTJ elements 10a and 10b connected in series. Moreover, the bit line 70 which is the other address wiring is extended above the two MTJ elements 10a and 10b connected in series in the direction orthogonal to the word line 72. Furthermore, a contact layer 208 is provided between the source region 202 and the MTJ element 10b, between the MTJ element 10b and the wiring 76, between the wiring 76 and the MTJ element 10a, and between the MTJ element 10a and the bit line 70. These are electrically connected to each other through the contact layer 208.

Furthermore, as described above, the MTJ elements 10a and 10b can write 1/0 information by reversing the magnetic moment of each storage layer 106 by spin torque magnetization reversal. Note that the specific stacked structure of the MTJ element 10 will be described later.

Moreover, the magnetic memory 1 is provided with a power supply circuit (not shown) capable of applying a desired current to the word line 72, the wiring 74, and the bit line 70. At the time of writing information, the power supply circuit applies a voltage to the address wiring (in other words, the word line 72 and the bit line 70) corresponding to a desired memory cell to which writing is to be performed, and supplies a current to the MTJ elements 10a and 10b. At this time, the potentials of the address wiring and the wiring 74 connected to the drain region 204 are appropriately adjusted so that the current flowing through the MTJ elements 10a and 10b becomes larger than the respective reverse currents (thresholds). As a result, the direction of the magnetic moment of each storage layer 106 of the MTJ elements 10a and 10b is reversed, and information can be written to the MTJ elements 10a and 10b. At this time, by appropriately adjusting the potential of the drain region 204 through the wiring 74, the direction of the current flowing to the MTJ elements 10a and 10b can be controlled, and the direction of reversing the magnetic moment in each storage layer 106 of the MTJ elements 10a and 10b can be controlled. In other words, by appropriately adjusting the potential of the drain region 204, which of "1" and "0" information is to be written to the MTJ elements 10a and 10b can be controlled.

On the other hand, at the time of reading information, a voltage is applied to the word line 72 corresponding to a desired memory cell desired to be read by the above-described power supply circuit, and a current flowing from the wiring 76 or the bit line 70 through the MTJ elements 10a and 10b to the selection transistor 20 is detected. Since the electrical resistance of each of the MTJ elements 10a and 10b changes according to the direction of the magnetic moment in each storage layer 106 of the MTJ elements 10a and 10b due to the tunneling magnetoresistance (TMR) effect, 1/0 information can be read on the basis of the magnitude of the detected current value. At this time, since the current at the time of reading is much smaller than the current flowing at the time of writing, the direction of the magnetic moment in each storage layer 106 of the MTJ elements 10a and 10b does not change at the time of reading. That is, in the MTJ elements 10a and 10b, information in a nondestructive manner can be read. Note that the details of the reading method according to the present embodiment will be described later.

Next, details of the stacked structure of the MTJ elements 10a and 10b according to the present embodiment will be described. As shown in FIG. 1, the MTJ elements 10a and 10b have a structure in which a fixed layer 102 having the magnetic moment is fixed in a predetermined direction, a nonmagnetic layer 104, a storage layer 106 in which the direction of the magnetic moment is variable, and a cap layer 108 are sequentially stacked on a base layer 100.

In the present embodiment, the fixed layer 102 and the storage layer 106 include a ferromagnetic material. Examples of the ferromagnetic material include amorphous perpendicular magnetic materials such as TbFeCo and GdFeCo, or magnetic materials having crystal magnetic anisotropy such as CoPt and FePt. Moreover, examples of the ferromagnetic material also include an alloy magnetic material of at least one or more selected from Fe, Co, and Ni, and at least one or more selected from B and C. Note that the fixed layer 102 and the storage layer 106 preferably include a Co—Fe—B-based alloy magnetic material. Details of this will be described later.

Furthermore, in the fixed layer 102, the direction of the magnetic moment should not be changed by writing or reading, but the fixed layer 102 does not necessarily have to be fixed in a specific direction. For example, it is sufficient that the direction of the magnetic moment is less likely to change compared to the storage layer 106 by increasing the coercive force, increasing the film thickness, or increasing the magnetic damping constant of the fixed layer 102 compared to the storage layer 106. Furthermore, the direction of the magnetic moment is fixed by bringing an antiferromagnet such as PtMn or IrMn into contact with the fixed layer 102 or magnetically coupling a magnetic body in contact with the antiferromagnet thereof through a nonmagnetic body such as Ru.

Moreover, the fixed layer 102 may have a stacked ferri structure (also referred to as a stacked ferripin structure) in which at least two magnetic body layers and a nonmagnetic layer such as Ru are stacked. Since the fixed layer 102 has a stacked ferripin structure, it is possible to make blunted against an external magnetic field, block from the leakage magnetic field caused by the fixed layer 102, and reinforce the perpendicular magnetic anisotropy of the fixed layer 102 due to the interlayer coupling of a plurality of magnetic layers.

Furthermore, in the perpendicular magnetization film used in the storage layer 106, the composition is preferably adjusted so that the magnitude of the effective demagnetizing field received by the perpendicular magnetization film is smaller than the saturation magnetization amount Ms. For example, as described above, a Co—Fe—B alloy magnetic material is selected as the ferromagnetic material of the storage layer 106, and the magnitude of the effective demagnetizing field received by the storage layer 106 is reduced, so that the magnitude of the demagnetizing field is made smaller than the saturation magnetization amount Ms of the storage layer 106. As a result, the direction of the magnetic moment of the storage layer 106 can be made perpendicular to the film surface.

Furthermore, in the present embodiment, it is preferable to form the storage layer 106 so that the magnitude of the effective demagnetizing field received by the storage layer 106 is smaller than the saturation magnetization amount Ms of the storage layer 106. Thereby, the demagnetizing field received by the storage layer 106 becomes low, and the amount of writing current for reversing the direction of the magnetic moment of the storage layer 106 can be reduced. This is because the storage layer 106 has perpendicular magnetic anisotropy, so that the reverse current becomes small, which is advantageous in the demagnetizing field.

Moreover, in the present embodiment, the nonmagnetic layer 104 includes a nonmagnetic material. More specifically, the nonmagnetic layer 104 can be formed by using, for example, various insulators such as magnesium oxide, aluminum oxide, aluminum nitride, $SiO_2$, $Bi_2O_3$, $MgF_2$, CaF, $SrTiO_2$, $AlLaO_3$, or Al—N—O, dielectrics, and semiconductors. Furthermore, in a case where the nonmagnetic layer 104 includes magnesium oxide, the magnetoresistance ratio (MR ratio) can be increased. By thus increasing the MR ratio, the efficiency of spin injection can be improved, and the current density for reversing the direction of the magnetic moment of the storage layer 106 can be reduced. Furthermore, the material forming the nonmagnetic layer 104 may be replaced with a metal material, and spin injection may be performed by the giant magnetoresistive (GMR) effect. Moreover, the film thickness of the nonmagnetic layer 104 is adjusted so that the withstand voltage characteristics of each of the MTJ elements 10a and 10b can be sufficiently secured.

Furthermore, the base layer 100 and the cap layer 108 are used as an electrode and a control film of crystal orientation, and also as a protective layer. Specifically, the base layer 100 includes various metal materials or alloy materials, and realizes excellent conduction with an electrode layer (not shown) provided under the base layer 100. Furthermore, the cap layer 108 includes a nonmagnetic body such as Ru, for example, prevents oxidation of the fixed layer 102 and the storage layer 106 included in the MTJ element 10, and realizes excellent conduction with an electrode layer (not shown) provided on the cap layer 108.

Furthermore, in the above description, one memory cell of the magnetic memory 1 according to the present embodiment has been described as including two MTJ elements 10a and 10b connected in series, but in the present embodiment, it is not limited thereto. In the present embodiment, for example, three or more MTJ elements 10 connected with each other in series may be included in one memory cell. In this case, the thresholds of the reverse current at which the magnetic moment of each storage layer 106 of each MTJ element 10 included in one memory cell is reversed are different from each other, and the electric resistance values of each MTJ element 10 in the same resistance state are different from each other. In addition, in this case, the wirings 76 connected between the MTJ elements 10 are extended by an amount corresponding to the increase of the MTJ elements 10 included in one memory cell.

Furthermore, the MTJ elements 10a and 10b according to the present embodiment can be formed by continuously forming a part from the base layer 100 to the cap layer 108 in a vacuum device, and then patterning the MTJ elements 10a and 10b by processing such as etching. Note that, two stacked MTJ elements 10a and 10b can be formed, for example, by forming the MTJ element 10b located on the lower side, then forming the contact layer 208, and forming the MTJ element 10a located on the upper side of the contact layer 208. Alternatively, the two stacked MTJ elements 10a and 10b can be formed by sequentially forming each stacked layer of the two MTJ elements 10a and 10b, and then patterning them together.

Moreover, as described above, in the magnetic memory 1 according to the present embodiment, the respective resistance values in the same resistance state of the MTJ elements 10a and 10b included in one memory cell are different from each other. Furthermore, in the magnetic memory 1 according to the present embodiment, the thresholds of reverse current at which the magnetic moment of each storage layer 106 of the MTJ elements 10a and 10b included in one memory cell are reversed are different from each other. In other words, in the present embodiment, the stacked MTJ elements 10a and 10b have different characteristics. As described above, in a case where the MTJ elements 10a and 10b having different characteristics from each other are created, it is sufficient that the MTJ elements 10a and 10b are formed to have a stacked structure of materials having different compositions. Furthermore, the film thicknesses of each stacked layer of the MTJ elements 10a and 10b may be formed to be different from each other. Alternatively, the MTJ elements 10a and 10b may be formed by stacked layers of the materials having the same composition and of the same film thickness. In this case, it is sufficient that processing is performed so that the element cross-sectional shapes when cut by a plane perpendicular to the stacking direction of the MTJ elements 10a and 10b are different from each other. Specifically, in a case where the MTJ elements 10a and 10b are formed by stacked layers of the materials having the same composition and of the same film thickness, voltages necessary for reversal in the MTJ elements 10a and 10b are substantially the same. Accordingly, the reverse currents of the MTJ elements 10a and 10b can be set to different values by processing the sectional areas of the MTJ elements 10a and 10b when cut by planes perpendicular to the stacking direction to be different from each other. Moreover, in the present embodiment, the above-described methods may be combined to create the MTJ elements 10a and 10b having different characteristics.

Figure 5:
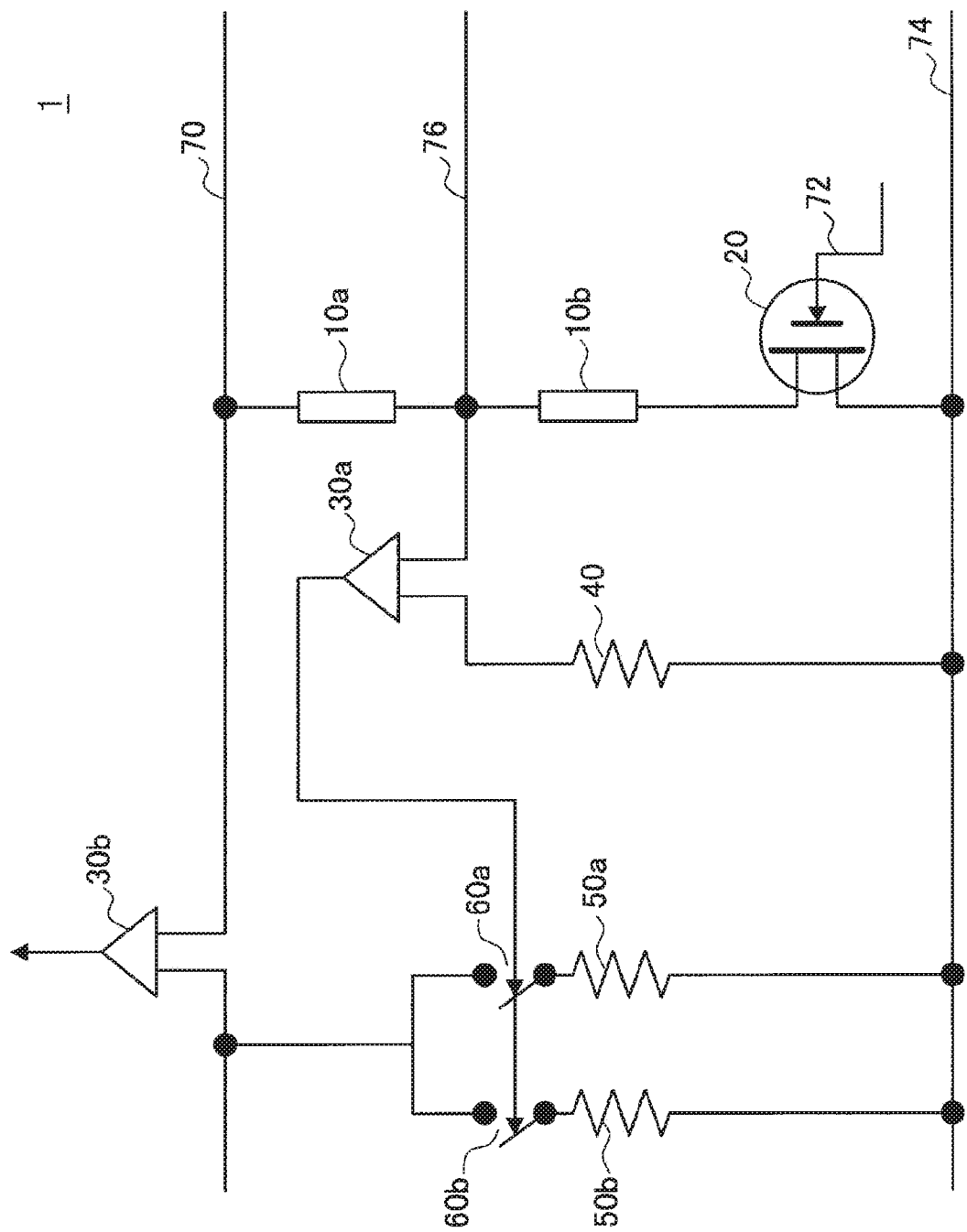
FIG. 5 is a circuit diagram schematically showing an example of a peripheral circuit of the magnetic memory 1 according to an embodiment of the present disclosure.

Next, an example of peripheral circuits necessary for reading of the magnetic memory 1 according to the present embodiment will be described with reference to FIG. 5. FIG. 5 is a circuit diagram schematically showing an example of a peripheral circuit of the magnetic memory 1 according to the present embodiment. As shown in FIG. 5, with respect to the memory cell of the magnetic memory 1 according to the above-described present embodiment, the peripheral circuit mainly includes two sense amplifiers 30a and 30b, three reference elements 40, 50a, and 50b, and two switches 60a and 60b.

The reference elements 40, 50a, and 50b included in the peripheral circuit include, for example, resistance elements, and are used as references when the sense amplifiers 30a and 30b as described later determine the resistance states of the MTJ elements 10a and 10b. More specifically, the reference element 40 is set to an intermediate resistance value between the resistance value (Rb+ΔRb) in a case where the MTJ element 10b is in the high resistance state, and the resistance value (Rb) in a case where the MTJ element 10b is in the low resistance state. The reference element 50a is set to an intermediate resistance value between the combined value (Ra+Rb+ΔRa) of the resistance in a case where MTJ element 10b is in the low resistance state and the MTJ element 10a is in the high resistance state, and the combined value (Ra+Rb) of the resistance in a case where the MTJ element 10b is in the low resistance state and the MTJ element 10a is in the low resistance state. The reference element 50b is set to an intermediate resistance value between the combined value (Ra+Rb+ΔRa+ΔRb) of the resistance in a case where the MTJ element 10b is in the high resistance state and the MTJ element 10a is in the high resistance state, and the combined value (Ra+Rb+ΔRb) of the resistance in a case where the MTJ element 10b is in the high resistance state and the MTJ element 10a is in the low resistance state.

The sense amplifiers 30a and 30b have a function of detecting the sense current passing through the MTJ elements 10a and 10b or the like, and the reference current passing through the reference elements 40, 50a, and 50b, and comparing the values of these currents. Specifically, the sense amplifier (first determination unit) 30a compares the sense current by the resistance of the MTJ element 10b with the reference current by the reference element 40 to determine the resistance state of the MTJ element 10b. Moreover, the sense amplifier 30a controls the switches 60a and 60b on the basis of the determination result, and switches the reference element used by the sense amplifier (second determination unit) 30b to one of the reference elements 50a and 50b. Furthermore, the sense amplifier 30b compares the sense current by the combined resistance of the MTJ elements 10a and 10b with the reference current by the reference elements 50a and 50b to determine the resistance state of the combined resistance of the MTJ elements 10a and 10b.

Specifically, a power supply circuit (not shown) included in the magnetic memory 1 applies a voltage to the word line 72 corresponding to a desired memory cell to be read. Then, the sense amplifier 30a detects the current flowing from the wiring 76 through the MTJ element 10b to the selection transistor 20, and compares the value of the current with the current value flowing through the reference element 40 to determine the resistance state of the MTJ element 10b. Furthermore, the sense amplifier 30b detects the current flowing from the bit line 70 through the MTJ elements 10a and 10b to the selection transistor 20, and compares the value of the current with the current value flowing to either of the reference elements 50a and 50b. Then, the sense amplifier 30b determines the resistance state of the combined resistance of the MTJ elements 10a and 10b by the comparison.

Note that, in the present embodiment, the peripheral circuits and the like are not limited to the circuits shown in FIG. 5, and other peripheral circuits may be used. For example, in the present embodiment, the peripheral circuit may be configured by one sense amplifier. In this case, the sense amplifier is electrically connected to the plurality of MTJ elements, reference elements, and wirings included in the magnetic memory 1 through a plurality of switches.

The configuration of the magnetic memory 1 according to the present embodiment has been described above. Note that the configuration of the magnetic memory 1 according to the present embodiment is not limited to the one described above. In other words, in the magnetic memory according to the present embodiment, the MTJ elements 10a and 10b are connected with each other in series as shown in FIGS. 2 to 4 and included in one memory cell, and it is sufficient that the wiring 76 is provided between the MTJ elements 10a and 10b. Furthermore, in the present embodiment, the stacked structure of each of the MTJ elements 10a and 10b and the configuration of the peripheral circuit are not limited to those shown in FIGS. 1 and 5.

2.2. Reading Method

Figure 6:
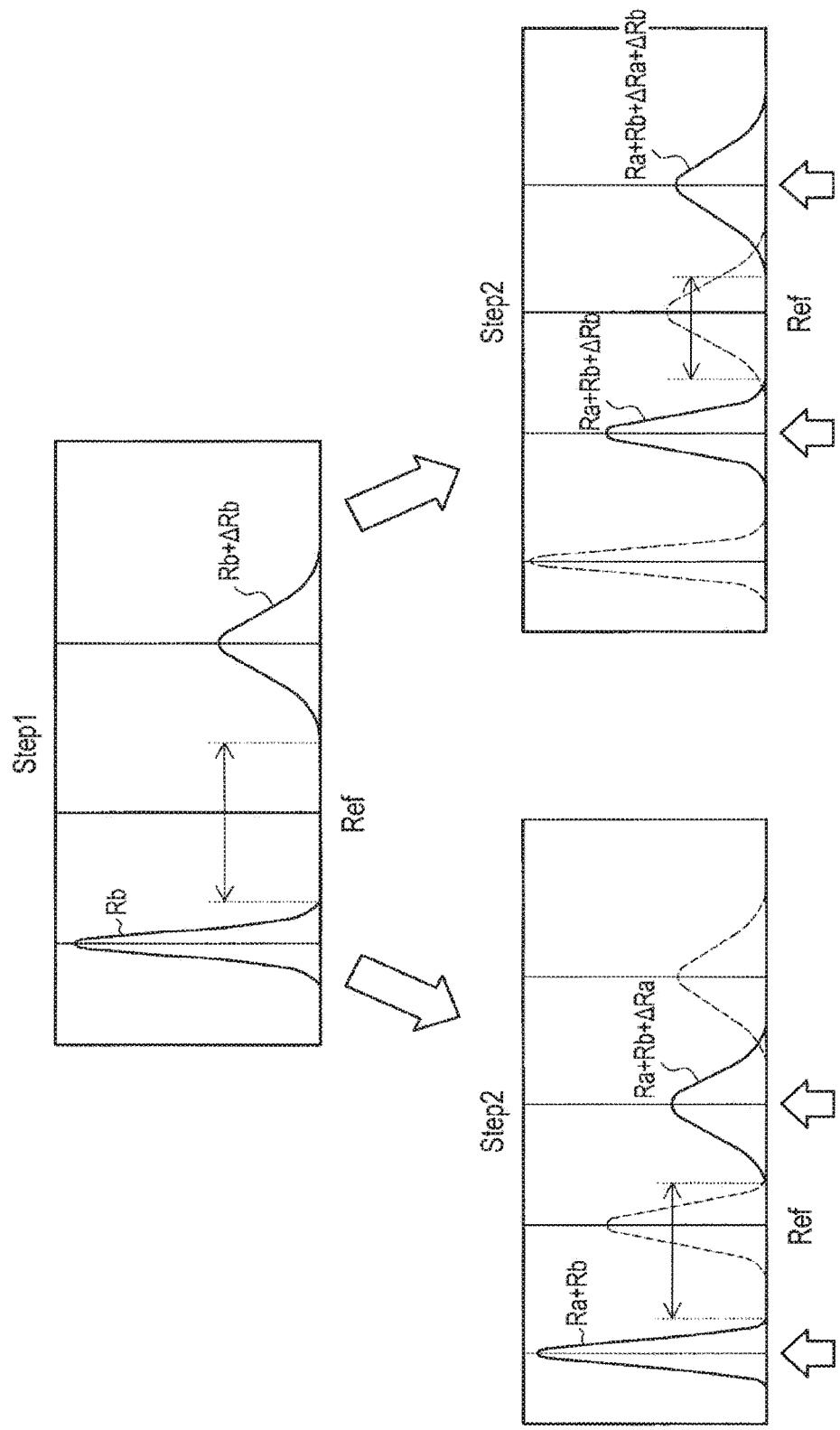
FIG. 6 is an explanatory diagram for explaining a method of reading the magnetic memory 1 according to an embodiment of the present disclosure.

Next, a method of reading the magnetic memory 1 according to the above-described present embodiment will be described with reference to FIG. 6. FIG. 6 is an explanatory diagram for explaining a reading method of the magnetic memory 1 according to the present embodiment.

The reading according to the present embodiment is performed in two steps. Note that the upper part of FIG. 6 shows probability density distributions of two resistance states of the MTJ element 10b in the first step (indicated by a solid line in the drawing). Moreover, the left of the lower part of FIG. 6 shows probability density distributions of two resistance states of the combined resistance of the MTJ elements 10a and 10b in a case where the MTJ element 10b is in the low resistance state (indicated by a solid line in the drawing). Furthermore, the right of the lower part of FIG. 6 shows probability density distributions of two resistance states of the combined resistance of the MTJ elements 10a and 10b in a case where the MTJ element 10b is in the high resistance state. Note that the probability density distribution indicates the spread of the variation in resistance values in each resistance state and the probability of the resistance value, in consideration of manufacturing variation and the like.

First, in a first step, a voltage is applied to the word line 72 corresponding to a desired memory cell to be read by a power supply circuit (not shown) included in the magnetic memory 1. Moreover, the power supply circuit applies a reading current to the MTJ element 10b through the wiring 76, and the sense amplifier 30a determines the resistance state of the MTJ element 10b. Specifically, the reference element 40 used in determination of the first step is set to an intermediate resistance value between the resistance value (Rb+ΔRb) in a case where the MTJ element 10b is in the high resistance state, and the resistance value (Rb) in a case where the MTJ element 10b is in the low resistance state. Then, as shown in the upper part of FIG. 6, the sense amplifier 30a detects the current flowing from the wiring 76 through the MTJ element 10b to the selection transistor 20, and compares the value of the current with the current value flowing through the reference element 40. From the result of the comparison, it can be determined whether the resistance state of the MTJ element 10b is any of the low resistance state (Rb) and the high resistance state (Rb+ΔRb). In the upper part of FIG. 6, the width along the X axis direction between the end located on the most right of the spread of the probability density distribution in the low resistance state (Rb) and the end located on the most left of the spread of the probability density distribution in the high resistance state (Rb+ΔRb) corresponds to a read margin.

Moreover, in the first step, the sense amplifier 30a determines the resistance state of the MTJ element 10b, and according to the determined resistance state of the MTJ element 10b, the determination state of the sense amplifier 30b performing the determination in a second step is switched.

Specifically, in the first step, in a case where the MTJ element 10b is determined to be in the low resistance state (Rb), the determination state of the sense amplifier 30b is switched as follows. In this case, from the result of the first step, the resistance state of the MTJ elements 10a and 10b among four resistance states (Ra+Rb, Ra+Rb+ΔRb, Ra+Rb+ΔRa, and Ra+Rb+ΔRa+ΔRb) obtained by combining the MTJ element 10a and the MTJ element 10b is either the lowest resistance state (Ra+Rb) or the third lowest resistance state (Ra+Rb+ΔRa)(the solid line in the left in the lower part of FIG. 6). So, in such a case, the switch 60a is closed, the switch 60b is opened, and the determination state of the sense amplifier 30b is switched so that the reference element 50a is used as a reference element used for reading the sense amplifier 30b. Note that the reference element 50a is set to have an intermediate resistance value between the lowest resistance state (Ra+Rb) and the third lowest resistance state (Ra+Rb+ΔRa).

Then, in the second step, the power supply circuit (not shown) applies a reading current to the MTJ element 10a and the MTJ element 10b through the bit line 70. Moreover, the sense amplifier 30b detects the current flowing from the bit line 70 through the MTJ element 10a and the MTJ element 10b to the selection transistor 20, and compares the value of the current with the current value flowing through the reference element 50a. In this way, sense amplifier 30b can determine whether the resistance state of the combined resistance of the MTJ elements 10a and 10b is any of the lowest resistance state (Ra+Rb) or the third lowest resistance state (Ra+Rb+ΔRa). Moreover, in combination with the determination result in the first step, it can be determined whether the resistance state of the MTJ element 10a is either the low resistance state (Ra) or the high resistance state (Ra+ΔRa).

Note that, at this time, as shown in the left of the lower part of FIG. 6, the sense amplifier 30b determines whether a state is any of two resistance states (Ra+Rb and Ra+Rb+ΔRa) adjacent to each other via one resistance state among four resistance states described above (probability density distribution indicated by a solid line in the left of the lower part of FIG. 6). Furthermore, in the left of the lower part of FIG. 6, the width along the X axis direction between the end located on the most right of the spread of the probability density distribution in the lowest resistance state (Ra+Rb) and the end located on the most left of the spread of the probability density distribution in the third lowest resistance state (Ra+Rb+ΔRa) corresponds to a read margin.

In other words, as shown in the left of the lower part of FIG. 6, the sense amplifier 30b determines whether a state is any of two resistance states (Ra+Rb and Ra+Rb+ΔRa) adjacent to each other via one resistance state among four resistance states described above, not determining whether a state is any of the two resistance states directly adjacent to each other. As shown in the left of the lower part of FIG. 6, in the directly adjacent resistance state (probability density distributions shown by solid lines and broken lines), there is a portion where the tails of the probability density distributions overlap each other. As described above, in a case where the tails of the probability density distributions overlap, there is a possibility that the difference between the resistance states in which the sense amplifiers 30b are adjacent cannot be determined depending on the manufacturing variation. On the other hand, in the present embodiment, whether a state is any of two resistance states (Ra+Rb and Ra+Rb+ΔRa) adjacent to each other via one resistance state is determined (the probability density distribution indicated by a solid line in FIG. 6). As shown in the left of the lower part of FIG. 6, in two resistance states (Ra+Rb and Ra+Rb+ΔRa) adjacent via one resistance state, the probability density distributions indicated by solid lines do not overlap each other. Moreover, the read margins of the two resistance states (Ra+Rb and Ra+Rb+ΔRa) also have sufficiently large widths. Accordingly, it can be understood that the sense amplifier 30b can accurately determine whether a state is any of two adjacent resistance states (Ra+Rb and Ra+Rb+ΔRa) adjacent to each other via one resistance state. In other words, in the present embodiment, the read margin can be sufficiently secured by determining whether a state is any of two resistance states adjacent to each other via one resistance state.

On the other hand, in the first step, in a case where the MTJ element 10b is determined to be in the high resistance state (Rb+ΔRb), the determination state of the sense amplifier 30b is switched as follows. In this case, from the result of the first step, the resistance state of the MTJ elements 10a and 10b among four resistance states (Ra+Rb, Ra+Rb+ΔRb, Ra+Rb+ΔRa, and Ra+Rb+ΔRa+ΔRb) obtained by combining the MTJ element 10a and the MTJ element 10b is either the second lowest resistance state (Ra+Rb+ΔRb) or the highest resistance state (Ra+Rb+ΔRa+ΔRb)(the solid line in the right in the lower part of FIG. 6). So, in such a case, the switch 60a is opened, the switch 60b is closed, and the determination state of the sense amplifier 30b is switched so that the reference element 50b is used as a reference element used for reading the sense amplifier 30b. Note that the reference element 50b is set to have an intermediate resistance value between the second lowest resistance state (Ra+Rb+ΔRb) and the highest resistance state (Ra+Rb+ΔRa+ΔRb).

Then, in the second step, the power supply circuit (not shown) applies a reading current to the MTJ element 10a and the MTJ element 10b through the bit line 70. Moreover, the sense amplifier 30b detects the current flowing from the bit line 70 through the MTJ element 10a and the MTJ element 10b to the selection transistor 20, and compares the value of the current with the current value flowing through the reference element 50b. In this way, sense amplifier 30b can determine whether the resistance state of the MTJ element 10a and the MTJ element 10b is any of the second lowest resistance state (Ra+Rb+ΔRb) and the highest resistance state (Ra+Rb+ΔRa+ΔRb). Moreover, in combination with the determination result in the first step, it can be determined whether the resistance state of the MTJ element 10a is either the low resistance state (Ra) or the high resistance state (Ra+ΔRa).

Note that, at this time, as shown in the right of the lower part of FIG. 6, the sense amplifier 30b determines whether a state is any of two resistance states (Ra+Rb+ΔRb and Ra+Rb+ΔRa+ΔRb) adjacent to each other via one resistance state among four resistance states described above (probability density distribution indicated by a solid line in the right of the lower part of FIG. 6). Furthermore, in the right of the lower part of FIG. 6, the width along the X axis direction between the end located on the most right of the spread of the probability density distribution in the second lowest resistance state (Ra+Rb+ΔRb) and the end located on the most left of the spread of the probability density distribution in the highest resistance state (Ra+Rb+ΔRa+ΔRb) corresponds to a read margin.

In other words, as shown in the right of the lower part of FIG. 6, the sense amplifier 30b determines whether a state is any of two resistance states (Ra+Rb+ΔRb and Ra+Rb+ΔRa+ΔRb) adjacent to each other via one resistance state among four resistance states described above, not determining whether a state is any of the two resistance states) directly adjacent to each other. In the present embodiment, as shown in the right of the lower part of FIG. 6, in two resistance states (Ra+Rb+ΔRb and Ra+Rb+ΔRa+ΔRb) adjacent via one resistance state, the probability density distributions indicated by solid lines do not overlap each other. Moreover, the read margins of the two resistance states (Ra+Rb+ΔRb and Ra+Rb+ΔRa+ΔRb) also have sufficiently large widths. Accordingly, it can be understood that the sense amplifier 30b can accurately determine whether a state is any of two adjacent resistance states (Ra+Rb+ΔRb and Ra+Rb+ΔRa+ΔRb) adjacent to each other via one resistance state. In other words, in the present embodiment, the read margin can be sufficiently secured by determining whether a state is any of two resistance states adjacent to each other via one resistance state.

As described above, in the reading method according to the present embodiment, reading is performed in two steps, the reference element used in the second step is switched according to the determination result of the first step, and reading of the second step is performed. In this way, in a magnetic memory for storing multi-level information, reading can be performed while sufficiently securing a read margin.

Note that, for four resistance states (Ra+Rb, Ra+Rb+ΔRb, Ra+Rb+ΔRa, and Ra+Rb+ΔRa+ΔRb) obtained by combining the MTJ element 10a and the MTJ element 10b in order to secure a sufficient read margin, it is preferable that the differences between the resistance values of the resistance states be values close to each other. Furthermore, for the relationship between the lowest resistance state (Ra+Rb) and the third lowest resistance state (Ra+Rb+ΔRa), it is preferable that the resistance value of the third lowest resistance state (Ra+Rb+ΔRa) is about twice the resistance value of the lowest resistance state (Ra+Rb). Moreover, also for the relationship between the second lowest resistance state (Ra+Rb+ΔRb) and the highest resistance state (Ra+Rb+ΔRa+ΔRb), it is preferable that the resistance value of the highest resistance state (Ra+Rb+ΔRa+ΔRb) is about twice the resistance value of the second lowest resistance state (Ra+Rb+ΔRb).

3. Summary

As described above, according to the present embodiment, in the magnetic memory 1 for storing multi-level information, reading can be performed while sufficiently securing a read margin. Specifically, in the reading method according to the present embodiment, reading is performed in two steps, the resistance state of the MTJ element 10b is determined in the first step, and the reference element 50 used in the second step is switched according to the determination result in the first step. Moreover, in the reading method according to the present embodiment, in the second step, the resistance state of the combined resistance of the MTJ elements 10a and 10b is determined. Then, the reading method according to the present embodiment determines the stored information of the magnetic memory 1 storing the multi-level information having the two MTJ elements 10a and 10b using the determination results in the first and second steps. According to the present embodiment, the difference between the resistance values of the resistance states to be determined in this second step is approximately equal to the difference between the resistance values of the resistance states to be determined in the single bit magnetic memory. Thus, reading can be performed while sufficiently securing a read margin.

In other words, the magnetic memory 1 according to the embodiment of the present disclosure has a read margin approximately equal to that of a single bit magnetic memory despite storing multi-level information. Accordingly, according to the present embodiment, it is possible to realize high density and high capacity of the STT-MRAM without sacrificing the read margin.

Note that the magnetic memory 1 according to the present embodiment may be mounted on the same semiconductor chip together with a semiconductor circuit forming an operation device or the like to form a semiconductor device (System-on-a-Chip: SoC). Furthermore, the magnetic memory 1 according to the present embodiment may be mounted on various electric devices in which a storage device can be mounted. For example, the magnetic memory 1 may be mounted in various electronic devices such as various mobile devices (a smartphone a tablet personal computer (PC), and the like), a notebook PC, a wearable device, a game device, a music device, a video device, or a digital camera, as a memory for temporary storage or as a storage.

4. Supplement

While preferred embodiments of the present disclosure have been described above in detail with reference to the accompanying drawings, the technical scope of the present disclosure is not limited to such examples. It is obvious that various variations and modifications can be conceived within the scope of the technical idea described in the claims by a person having ordinary knowledge in the field of technology to which the present disclosure belongs, and, of course, it is understood that these variations and modifications belong to the technical scope of the present disclosure.

Furthermore, the effects described in this specification are merely illustrative or exemplary, and are not limitative. That is, the technique according to the present disclosure can exhibit other effects obvious to those skilled in the art from the description of the present specification together with the effects described above or instead of the effects described above.

Note that the following configuration is also within the technical scope of the present disclosure.

(1) A magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element on the basis of a current flowing to the first magnetic storage element through the third wiring; and a second determination unit that determines a magnetization state of the second magnetic storage element on the basis of a current flowing to the first and second magnetic storage elements through the first wiring, in which the determination state of the second determination unit is changed on the basis of the determination result of the first determination unit.

(2) The magnetic memory according to (1) described above, in which the second determination unit determines, among four resistance states that a combined resistance of the first and second magnetic storage elements corresponding to the magnetization states of the first and second magnetic storage elements may take, whether a state is any of two of the resistance states adjacent to each other via one of the resistance states to determine a magnetization state of the second magnetic storage element.

(3) The magnetic memory according to (1) or (2) described above, further including a plurality of reference elements used when the first and second determination units determine the magnetization states of the first and second magnetic storage elements, in which the reference elements used by the second determination unit are switched to change the determination state of the second determination unit.

(4) The magnetic memory according to (3) described above, further including a switch that switches the reference elements electrically connected to the second determination unit on the basis of the determination result of the first determination unit.

(5) The magnetic memory according to any one of (1) to (4) described above, in which the first and second magnetic storage elements have different electric resistance values in the same storage state.

(6) The magnetic memory according to (5) described above, in which the first and second magnetic storage elements have different cross-sectional shapes or cross-sectional areas.

(7) The magnetic memory according to any one of (1) to (6) described above, in which the first and second magnetic storage elements include spin injection magnetic storage elements of perpendicular magnetization type.

(8) The magnetic memory according to any one of (1) to (6) described above, in which the first and second magnetic storage elements include spin injection magnetic storage elements of in-plane magnetization type.

(9) A semiconductor device including a magnetic memory including a plurality of magnetic storage elements that holds information in a magnetization state of a magnetic body, and an operation device provided on the same chip as the magnetic memory, the magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element on the basis of a current flowing to the first magnetic storage element through the third wiring; and a second determination unit that determines a magnetization state of the second magnetic storage element on the basis of a current flowing to the first and second magnetic storage elements through the first wiring, in which the determination state of the second determination unit is changed on the basis of the determination result of the first determination unit.

(10) An electronic device including a magnetic memory including a plurality of magnetic storage elements that holds information in a magnetization state of a magnetic body, the magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element on the basis of a current flowing to the first magnetic storage element through the third wiring; and a second determination unit that determines a magnetization state of the second magnetic storage element on the basis of a current flowing to the first and second magnetic storage elements through the first wiring, in which the determination state of the second determination unit is changed on the basis of the determination result of the first determination unit.

(11) A method of reading a magnetic memory including a plurality of magnetic storage elements that holds information in a magnetization state of a magnetic body, the magnetic memory including: first and second magnetic storage elements that are provided between a first wiring and a second wiring crossing each other, and are electrically connected in series; a third wiring electrically connected between the first and second magnetic storage elements; a first determination unit that determines a magnetization state of the first magnetic storage element; and a second determination unit that determines a magnetization state of the second magnetic storage element, the method including determining by the first determination unit the magnetization state of the first magnetic storage element on the basis of a current flowing to the first magnetic storage element through the third wiring, changing a determination state of the second determination unit on the basis of the determination result of the first determination unit, and determining by the second determination unit the magnetization state of the second magnetic storage element on the basis of a current flowing to the first and second magnetic storage elements through the first wiring.

(12) The method of reading a magnetic memory according to (11) described above, in which determination of the magnetization state of the second magnetic storage element is performed by determining, among four resistance states that a combined resistance of the first and second magnetic storage elements corresponding to the magnetization states of the first and second magnetic storage elements may take, whether a state is any of two of the resistance states adjacent to each other via one of the resistance states.

REFERENCE SIGNS LIST

1 Magnetic memory
10, 10a, 10b MTJ element
20 Selection transistor
30a, 30b Sense amplifier
40, 50a, 50b Reference element
60a, 60b Switch
70 Bit line
72 Word line
74,76 Wiring
100 Base layer
102 Fixed layer
104 Nonmagnetic layer
106 Storage layer
108 Cap layer
200 Semiconductor substrate
202 Source region
204 Drain region
206 Element separation layer
208 Contact layer

The invention claimed is:

1. A magnetic memory comprising:
  first and second magnetic storage elements that are provided between a first wiring and a second wiring crossing each other, and are electrically connected in series;
  a third wiring electrically connected between the first and second magnetic storage elements;
  a first determination unit that determines a magnetization state of the first magnetic storage element on a basis of a current flowing to the first magnetic storage element through the third wiring; and
  a second determination unit that determines a magnetization state of the second magnetic storage element on a basis of a current flowing to the first and second magnetic storage elements through the first wiring,
  wherein a determination state of the second determination unit is changed on a basis of a determination result of the first determination unit.

2. The magnetic memory according to claim 1, wherein the second determination unit determines, among four resistance states that a combined resistance of the first and second magnetic storage elements corresponding to the magnetization states of the first and second magnetic storage elements may take, whether a state is any of two of the resistance states adjacent to each other via one of the resistance states to determine the magnetization state of the second magnetic storage element.

3. The magnetic memory according to claim 1,
  further comprising a plurality of reference elements used when the first and second determination units determine the magnetization states of the first and second magnetic storage elements,
  wherein the reference elements used by the second determination unit are switched to change the determination state of the second determination unit.

4. The magnetic memory according to claim 3, further comprising a switch that switches the reference elements electrically connected to the second determination unit on a basis of the determination result of the first determination unit.

5. The magnetic memory according to claim 1, wherein the first and second magnetic storage elements have different electric resistance values in same storage state.

6. The magnetic memory according to claim 5, wherein the first and second magnetic storage elements have different cross-sectional shapes or cross-sectional areas.

7. The magnetic memory according to claim 1, wherein the first and second magnetic storage elements comprise spin injection magnetic storage elements of perpendicular magnetization type.

8. The magnetic memory according to claim 1, wherein the first and second magnetic storage elements comprise spin injection magnetic storage elements of in-plane magnetization type.

9. A semiconductor device comprising
  a magnetic memory including a plurality of magnetic storage elements that holds information in a magnetization state of a magnetic body, and
  an operation device provided on same chip as the magnetic memory,
  the magnetic memory including:
  first and second magnetic storage elements that are provided between a first wiring and a second wiring crossing each other, and are electrically connected in series;
  a third wiring electrically connected between the first and second magnetic storage elements;
  a first determination unit that determines a magnetization state of the first magnetic storage element on a basis of a current flowing to the first magnetic storage element through the third wiring; and
  a second determination unit that determines a magnetization state of the second magnetic storage element on a basis of a current flowing to the first and second magnetic storage elements through the first wiring,
  wherein a determination state of the second determination unit is changed on a basis of a determination result of the first determination unit.

10. An electronic device comprising
  a magnetic memory including a plurality of magnetic storage elements that holds information in a magnetization state of a magnetic body,
  the magnetic memory including:
  first and second magnetic storage elements that are provided between a first wiring and a second wiring crossing each other, and are electrically connected in series;
  a third wiring electrically connected between the first and second magnetic storage elements;
  a first determination unit that determines a magnetization state of the first magnetic storage element on a basis of a current flowing to the first magnetic storage element through the third wiring; and a second determination unit that determines a magnetization state of the second magnetic storage element on a basis of a current flowing to the first and second magnetic storage elements through the first wiring,
wherein a determination state of the second determination unit is changed on a basis of a determination result of the first determination unit.

11. A method of reading a magnetic memory including a plurality of magnetic storage elements that holds information in a magnetization state of a magnetic body,
the magnetic memory including:
first and second magnetic storage elements that are provided between a first wiring and a second wiring crossing each other, and are electrically connected in series;
a third wiring electrically connected between the first and second magnetic storage elements;
a first determination unit that determines a magnetization state of the first magnetic storage element; and
a second determination unit that determines a magnetization state of the second magnetic storage element,
the method comprising determining by the first determination unit the magnetization state of the first magnetic storage element on a basis of a current flowing to the first magnetic storage element through the third wiring,
changing a determination state of the second determination unit on a basis of a determination result of the first determination unit, and
determining by the second determination unit the magnetization state of the second magnetic storage element on a basis of a current flowing to the first and second magnetic storage elements through the first wiring.

12. The method of reading the magnetic memory according to claim 11,
wherein the determination of the magnetization state of the second magnetic storage element is performed by determining, among four resistance states that a combined resistance of the first and second magnetic storage elements corresponding to the magnetization states of the first and second magnetic storage elements may take, whether a state is any of two of the resistance states adjacent to each other via one of the resistance states.

* * * * *